(12) United States Patent
Iizuka et al.

(10) Patent No.: US 9,341,776 B2
(45) Date of Patent: May 17, 2016

(54) OPTICAL INTERCONNECTION DEVICE AND METHOD OF MANUFACTURING THE SAME

(71) Applicant: Kabushiki Kaisha Toshiba, Minato-ku (JP)

(72) Inventors: Norio Iizuka, Kanagawa (JP); Kazuya Ohira, Tokyo (JP); Haruhiko Yoshida, Chiba (JP); Mizunori Ezaki, Kanagawa (JP); Hideto Furuyama, Kanagawa (JP); Kentaro Kobayashi, Tokyo (JP); Hiroshi Uemura, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/960,388

(22) Filed: Aug. 6, 2013

(65) Prior Publication Data
US 2014/0044391 A1    Feb. 13, 2014

(30) Foreign Application Priority Data

Aug. 9, 2012  (JP) .................................. 2012-177604

(51) Int. Cl.
*G02B 6/26* (2006.01)
*G02B 6/42* (2006.01)
(Continued)

(52) U.S. Cl.
CPC .............. *G02B 6/131* (2013.01); *H01L 31/173* (2013.01); *H01S 5/0264* (2013.01); *H01S 5/1071* (2013.01); *G02B 6/12002* (2013.01); *G02B 6/12004* (2013.01); *G02B 6/1228* (2013.01)

(58) Field of Classification Search
CPC ..... H01S 5/0264; H01S 5/026; H01S 5/1071; H01S 5/1075; H01S 31/173; G02B 6/131

USPC ........ 385/14, 15, 30; 257/146, 444, E33.076, 257/E33.077, E27.001; 438/24, 28, 31
See application file for complete search history.

(56) References Cited

U.S. PATENT DOCUMENTS 4,470,143 A * 9/1984 Kitamura .............. H01S 5/0264
                                                       257/E33.076
4,675,518 A * 6/1987 Oimura .................... H03K 3/42
                                                              250/205

(Continued)

FOREIGN PATENT DOCUMENTS

JP       2000-235127 A    8/2000
JP       2001-124565 A    5/2001

(Continued)

OTHER PUBLICATIONS

"Increasing the coupling efficiency of a microdisk laser to waveguides by using well designed spiral structures" by Liu et al, Journal of Applied Physics, vol. 107, 043105, 2010.*

(Continued)

*Primary Examiner* — Robert Tavlykaev
(74) *Attorney, Agent, or Firm* — Oblon, McClelland, Maier & Neustadt, L.L.P.

(57) ABSTRACT

An optical interconnection device includes a light-emitting element, a light-receiving element, and an optical waveguide. Both the light-emitting element and the light-receiving element have a layered structure and are formed on a silicon substrate. At least a portion of the light-emitting element is embedded in an insulator. At least a portion of the light-receiving element is embedded in the insulator. The optical waveguide is formed over the insulator, and is optically coupled to the light-emitting element and the light-receiving element by distributed coupling.

23 Claims, 39 Drawing Sheets

(51) Int. Cl.
*H01L 21/00* (2006.01)
*G02B 6/13* (2006.01)
*H01S 5/026* (2006.01)
*H01S 5/10* (2006.01)
*H01L 31/173* (2006.01)
*G02B 6/12* (2006.01)
*G02B 6/122* (2006.01)

(56) References Cited

U.S. PATENT DOCUMENTS

| | | | | |
|---|---|---|---|---|
| 4,989,214 A * | 1/1991 | Kwa | ............ | H01S 5/0264 372/33 |
| 5,032,879 A * | 7/1991 | Buchmann | ............ | H01S 5/0264 257/432 |
| 5,239,189 A * | 8/1993 | Lawrence | ............ | 257/81 |
| 5,398,256 A * | 3/1995 | Hohimer et al. | ............ | 372/94 |
| 8,848,760 B2 * | 9/2014 | Vahala et al. | ............ | 372/92 |
| 2002/0130329 A1 * | 9/2002 | Furukawa | ............ | G02B 6/12 257/98 |
| 2003/0218119 A1 * | 11/2003 | Stegmuller | ............ | B82Y 10/00 250/214.1 |
| 2009/0078963 A1 | 3/2009 | Khodja | | |
| 2009/0087144 A1 | 4/2009 | Yoshida | | |
| 2012/0063717 A1 | 3/2012 | Grenouillet et al. | | |
| 2012/0230635 A1 | 9/2012 | Yoshida | | |

FOREIGN PATENT DOCUMENTS

| | | |
|---|---|---|
| JP | 2002-122750 A | 4/2002 |
| JP | 2006-156870 A | 6/2006 |
| JP | 2009-36873 | 2/2009 |
| JP | 2010-152274 | 7/2010 |
| JP | 2011-164406 A | 8/2011 |
| WO | WO 99/17142 A | 8/1999 |

OTHER PUBLICATIONS

Office Action issued Jan. 20, 2015, in Japanese Patent Application No. 2012-177604, filed Aug. 9, 2012, w/English-language Translation.

Office Action issued Jun. 3, 2014 in Japanese Patent Application No. 2012-177604 (with English language translation).

Office Action issued Aug. 26, 2014 in Japanese Patent Application No. 2012-177604 (with English Translation).

Office Action issued on Jun. 16, 2015 in Japanese Patent Application No. 2014-157434 with English translation for a different application, not the foreign application from which priority is claimed.

* cited by examiner

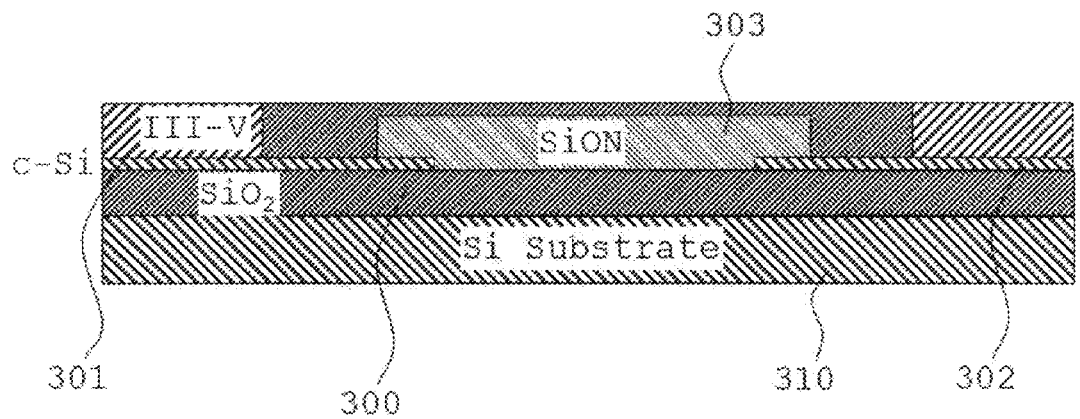
FIG. 31 *Related Art*
(1) Manufacture of Waveguide
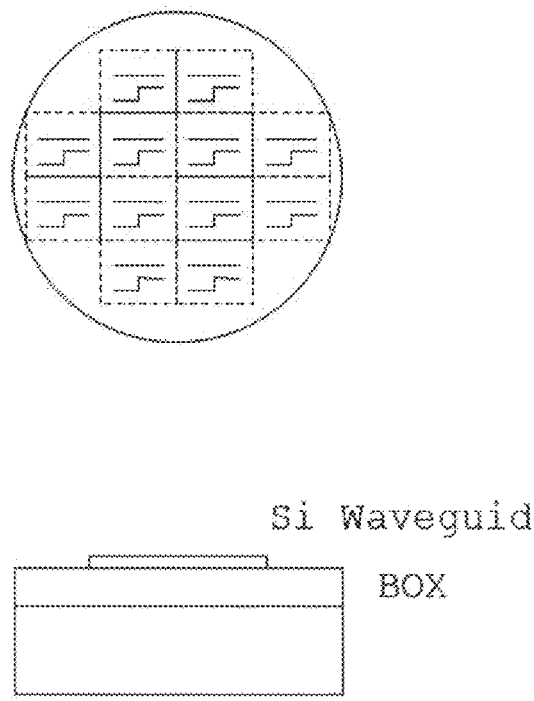
FIG. 32A (2) Embedding and Planarizing
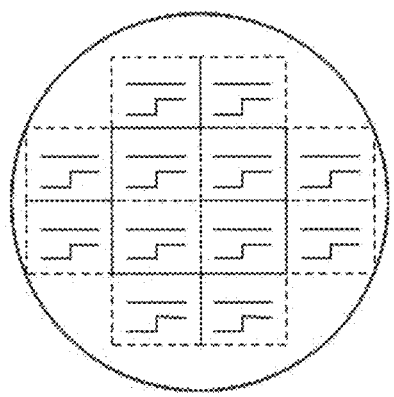
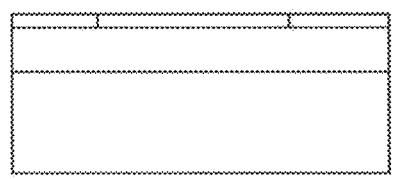
FIG.32B (3) Wafer Bonding and Substrate Removal

(4) Manufacture of Elements

OPTICAL INTERCONNECTION DEVICE AND METHOD OF MANUFACTURING THE SAME

CROSS REFERENCE TO RELATED APPLICATION

This application is based upon and claims the benefit of priority from the prior Japanese Patent Application No. 2012-177604, filed on Aug. 9, 2012, the entire contents of which are incorporated herein by reference.

FIELD

Embodiments described herein relate generally to an optical interconnection device and a method of manufacturing the device. The device includes a light emitting element, a light receiving element, and optical waveguides, all of which are integrated on a single substrate.

BACKGROUND

These days, high integration of LSI promotes miniaturization of circuits inside the LSI. The miniaturization decreases a cross-section of wiring line and a distance between adjacent wiring lines. Thus, the miniaturization increases wiring resistance and wiring capacitance inside the LSI. As a result, wiring delay determined by the wiring resistance and the wiring capacitance increases to make it difficult to more speed up the LSI. Optical interconnection technology draws attention as a technology to solve the wiring delay involved in the high integration of the LSI. The optical interconnection technology employs optical waveguides to transmit optical signals, and eliminates an increase in the wiring resistance and wiring capacitance involved in the miniaturization mentioned above. A disclosed optoelectric LSI transmits signals using such optical interconnections.

The optoelectric LSI includes several functional blocks to electrically perform signal processing, and optically transmits signals among the blocks. The optoelectric LSI needs a light emitting element for converting processed electric signals into optical ones and a light receiving element for converting transmitted optical signals into electrical ones. Semiconductor lasers are employed as a conversion element to convert electric signals into optical ones. Examples of the semiconductor lasers include an end surface emitting laser, a vertical cavity surface emitting laser (VCSEL), and a micro ring laser, reportedly operating in a GHz band.

Known integration of semiconductor lasers and optical waveguides includes the following configurations:
(1) a laser structure is integrated on optical waveguides by wafer bonding;
(2) a laser structure and optical waveguides are bonded to each other via an organic film; and
(3) a laser structure and optical waveguides are directly mounted on a Si wafer. The configuration (1) cannot efficiently remove heat generated at the laser structure because the configuration includes an air space under the laser structure. The configuration (2) cannot efficiently remove heat because of the laser element formed on the organic film. In addition, the configuration (2) makes it difficult to efficiently couple light outputted from the laser element to the waveguides because of the organic film laid between the laser element and the optical waveguide. In contrast, the configuration (3) is likely to efficiently remove heat because both the laser structure and optical the waveguides are formed on the Si wafer. Alignment accuracy is, however, needed for the configuration (3) to align laser elements to the waveguides, and the elements are each mounted on the Si wafer, thereby causing a problem of mass production.

Accordingly, it is desired to form light emitting and receiving elements on a Si wafer without using a less thermally-conductive layer, such as an air layer and an organic material, etc.

BRIEF DESCRIPTION OF THE DRAWINGS

FIG. 31 is a cross-sectional view showing an example of another optical interconnection device in the related art;

FIGS. 32A to 32D are top views and corresponding sectional views showing process-flow steps in accordance with an eighth example;

DETAILED DESCRIPTION

Figure 1A:
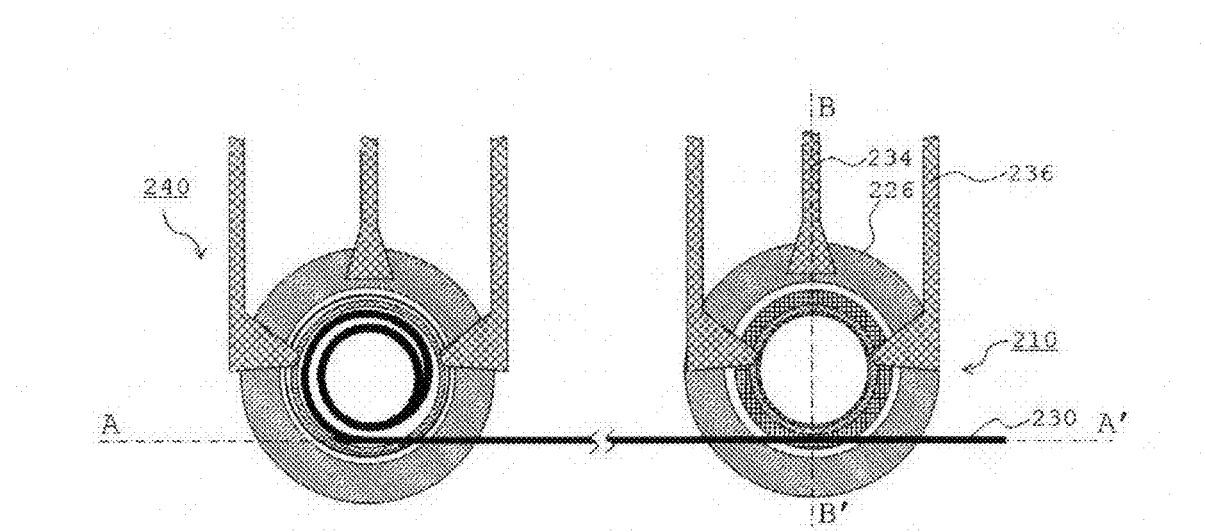
FIG. 1A is an upper view showing an optical interconnection device in accordance with a first example.

Development of an optical interconnection device and a method of manufacturing the device will be first described in accordance with examples. In order to form an optical interconnection device including a light emitting element and a light receiving element, compound semiconductors could be selectively grown on a Silicon substrate to form the elements, both being connected to each other with optical interconnections. In such a configuration, the selective growing is followed by formation of the optical elements, which differs from discrete integration of the individual elements, thereby leading to the productivity of the device to some extent.

Unfortunately, a very thick compound semiconductor layer grown on a Silicon substrate is needed to obtain sufficient crystallinity of the compound semiconductor layer by the heteroepitaxial growth. As a matter of fact, the above-mentioned technology requires a growth layer with a thickness of 4 μm, so thick, in addition to a film thickness of the elements, and should be improved from the view point of manufacturing cost or time. In the technology, a light direction is changed by obliquely polishing waveguides having a high refractive index, thereby forming optical interconnections. A silicon optical waveguide employed for an optical interconnection has a typical width of about 500 nm, i.e., which is very thin. A spot-size converter is needed to efficiently couple light to the thin optical interconnection because light is emitted from the light emitting element at a certain spread angle.

A known semiconductor device includes a light emitting element, a waveguide made up of an insulating film, and a light receiving element optically coupled to the waveguide. Epitaxial growth of mixed crystals, such as SiGeC and SiGe, is twice performed to form the light emitting device and to form the waveguide and the light receiving element. A Si-series semiconductor takes a long epitaxial-growth time because of the low epitaxial-growth rate of the Si-series semiconductor. Two-time epitaxial growth is disadvantageous in manufacturing cost or time, and should be improved. In the technology, SiGeC is used for the light emitting element while having unknown factors including luminance efficiency and consumption energy although SiGeC is direct transition semiconductor. Preferably, compound semiconductors including GaAs and InGaAs are used for the light emitting element because GaAs and InGaAs have been extensively studied in terms of high luminance efficiency or low energy consumption.

A configuration of optical elements is desired to eliminate the need for the way to form light emitting or receiving elements over a Silicon substrate via a less exoergic layer by heteroepitaxial growth. The device configuration should be achieved with a high accuracy by lithography, i.e., a mass-production method, to optically couple the elements to the waveguides.

An advance in the silicon photonics of late years is achieving a silicon waveguide with a high refractive index. The Si-based waveguide shows a low loss at a sharply-curved portion of the waveguide, and can be used for optical interconnections in an LSI on a Si chip. This is a key technology to achieve high speed, miniaturization, and low power consumption also for an interface with a memory having rapidly increasing capacity in addition to CMOS logic circuitry on the LSI. The silicon waveguide is suitable for optical coupling to light-emitting and light-receiving elements of compound semiconductors, and is advantageous for miniaturization and integration of transmitting/receiving units into the LSI chip with the silicon waveguide in contact with a compound semiconductor wafer. An optical waveguide employing amorphous silicon with low loss develops to enable a low-cost silicon optical interconnection without crystal silicon on an expensive SOI substrate.

Unfortunately, the silicon waveguide with a guide loss of 1 dB/cm is not suitable for a interconnection with a comparatively long distance of several to several tens of cm where the optical interconnection is clearly advantageous. Such a long-distance interconnection achieves a signal transmission with a low guide loss and large capacity by using a silicon-oxynitride waveguide or a polymer waveguide rather than by using the silicon waveguide. Accordingly, integrating the silicon waveguide, the silicon-oxynitride waveguide, the polymer waveguide, and optical devices of compound semiconductors on a single silicon wafer will achieve optical interconnections on a practical chip.

Unfortunately, the amorphous silicon waveguide deteriorates at temperatures of 200° C. or higher to reportedly increase the guide loss thereof, thereby making it difficult to integrate the amorphous silicon waveguide with the silicon-oxynitride waveguide that needs high-temperature process (at 200° C. to 500° C.).

Figure 30:
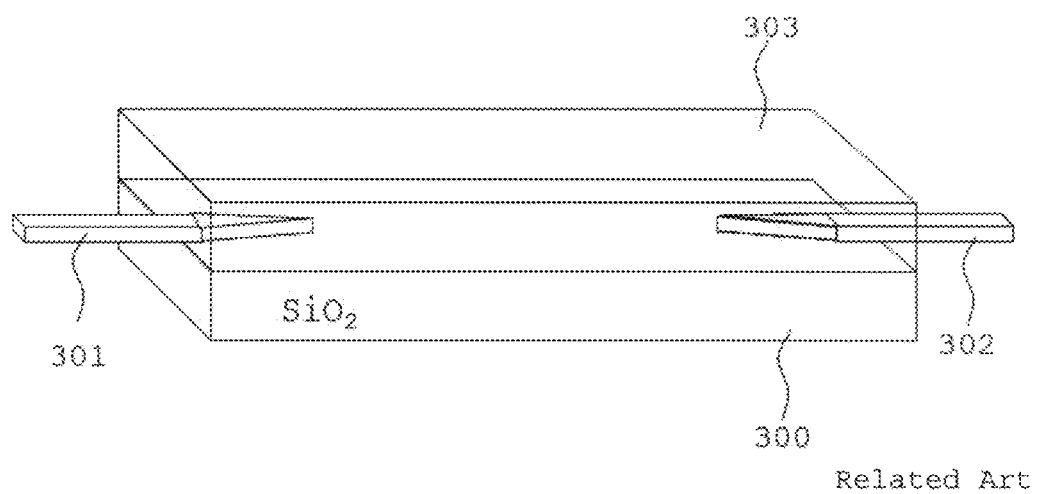
FIG. 30 illustrates an example of an optical interconnection device in the related art.

An example of an optical interconnection device in the related art is shown in FIGS. 30 and 31. A thin Si layer on a BOX layer of a SOI substrate is processed as a thin line with a cross-section of submicron square to provide a silicon waveguide 301. The silicon waveguide 301 is used for a short-distance (less than several cm) transmission and input-output of an optical transmitting/receiving device of compound semiconductor integrated by wafer bonding. A leading edge of the silicon waveguide is processed as a spot-size converter with an inverse tapered shape, over which a silicon-oxynitride layer is grown to be processed as a waveguide 303, in order to perform a long-distance (several to several tens of cm) transmission. A light output of a light-emitting device of compound semiconductor is coupled to the silicon waveguide to be first transmitted for a short distance. After the short-distance transmission, the light output is coupled to the silicon-oxynitride waveguide 303 via the spot-size converter to be transmitted for a long distance. After the short-distance transmission, the light output is again coupled to the silicon waveguide via the spot-size converter to be divided into each receiving device. As described above, accumulation of heat generated in the light emitting device and peripheral driving circuits deteriorates device characteristics because the light-emitting device is integrated by bonding onto the BOX layer ($SiO_2$) of the SOI substrate to make it difficult to release the heat. The SOI substrate is so expensive that the SOI substrate has a cost disadvantage. The amorphous silicon vulnerable to heat is difficult to use for a waveguide because forming the amorphous silicon waveguide is followed by forming the silicon-oxynitride at high temperatures.

Meanwhile, an optical waveguide with a small bend radius is also needed to achieve miniaturization of the integrated optical circuit because the bend radius is most important to the miniaturization of optical devices. An optical waveguide includes a core with a high refractive index and a clad with a low refractive index. The larger the difference ($\Delta n$) between the refractive indexes of the core and the clad, the smaller bend radius is achieved. The larger $\Delta n$ is, the more light is confined to the core. As a result, light is prevented from leaking to the outside at a steeply curved portion of the optical waveguide with a small bend radius. Such an optical waveguide is called an index guiding waveguide, and guides light by internal total reflections. Theoretically the index guiding waveguide can miniaturize not only the bend radius to several μm but also a guide loss without limit. The guide loss is experimentally so high that the guide loss reaches several tens of dB/cm or more. The high guide loss is known to be due to roughness of the sides of a processed waveguide.

Optical waveguides are commonly fabricated through lithographic exposure followed by dry etching in a photoresist method. The dry etching produces rough sidewalls of the optical waveguides. An index guiding waveguide is manufactured using an SOI (Silicon on Insulator) substrate. The SOI substrate intrinsically includes a clad layer (a $SiO_2$ layer) under a silicon layer thereof, thereby enabling it to use single crystal silicon for a waveguide layer. The single crystal silicon can provide a lower guide loss than amorphous or polycrystalline silicon because the single crystalline silicon has no grain boundaries that cause absorption or scattering of light. Using amorphous silicon containing hydrogen can reportedly provide an optical waveguide with a low guide loss. Thus, silicon is likely to be an ideal material for miniaturization and integration of optical devices. A total guide loss of a waveguide is not due to steeply bending of the waveguide but dominantly due to the rough sidewalls of the waveguide, thereby causing very high guide loss at present.

The amorphous silicon containing hydrogen causes another problem that chemical bonds of Si—H are broken in the amorphous silicon at temperatures of 400° C. or higher, so that the guide loss thereof increases. A guide loss of the index guiding waveguide is reportedly proportional to the cube of $\Delta n$. Accordingly, the index guiding waveguide is unlikely to be suitable for low-loss optical circuitry. The SOI substrate gives rise to $\Delta n$=Si (n=3.5)–$SiO_2$ (n=1.45)=2.1. This $\Delta n$ of the SOI-based waveguide is much higher than that of a silica-series waveguide, which is used for AWG (Arrayed Waveguide Gratings), leading to a high guide loss which is impractical. The improvement of the etching process is likely to reduce the roughness of the sidewalls while imposing a huge cost on installation of etching equipment and exposure equipment with uncertain effect.

A disclosed method of reducing the roughness of the sidewalls includes forming an oxide film on an etched surface by oxidation treatment. Unfortunately, the formation of the oxide film alters a shape of an optical waveguide in the disclosed method, and the oxide film undergoes high-temperature process to increase the guide loss thereof. The method makes it difficult to achieve highly efficient optical coupling by integrating optical waveguides, light emitting elements, and light receiving elements. In addition, after the oxidation treatment, the surface roughness can remain on the sidewalls.

The embodiment has been devised in view of the above description on optical interconnection devices of the related art, and has the objects of providing optical interconnection systems, optoelectrical devices, and electronic devices, all of which are capable of fast signal transmission, miniaturization, and easy manufacture.

A technical problem of the embodiment is to provide an optical interconnection device and a method of manufacturing the device. The method is highly efficient, provides excellent temperature characteristics to the device, eliminates the need for heteroepitaxial growth, and enables easy position control of elements and waveguides in the device.

Another technical problem is to provide an optical interconnection device enabling optical interconnections to have a low guide loss for a long distance of several tens of cm by integrating light emitting/receiving elements of compound semiconductors, optical waveguides of amorphous silicon, and optical waveguides of silicon oxynitride. Another technical problem is to provide an optical interconnection device and a method of manufacturing the device. The device is easily manufactured at low cost, and includes optical waveguides having a small bend radius and a low guide loss.

In order to solve the above-described problems, an in-chip or inter-chip optical interconnection system includes circuits provided on an integrated-circuit chip and optical waveguides that optically connect the circuits to each other and are provided on the chip.

In one embodiment, very fast data transmission is achieved by optical signals transmitting through optical waveguides among circuits provided on an integrated-circuit chip.

In one embodiment, CPU and memory devices are included in a circuit block to tremendously improve a signal-transmission speed between the CPU and the memory devices. The signal-transmission speed is a bottle neck of computers in the related art.

Preferably, the circuits are also electrically connected to each other in the in-chip or inter-chip optical interconnection system of the embodiment. In one embodiment, signals that do not need fast transmission or power supply may be transmitted through metal interconnections between circuit blocks, and signals that need fast transmission may be transmitted through optical interconnections therebetween.

In one embodiment, an optical interconnection system with a simple configuration is provided to achieve fast signal processing as a whole. Preferably, an in-chip or inter-chip optical interconnection unit and an integrated circuit include an optical interconnection unit having a light-emitting function or a light-receiving function, which is optically connected to the optical waveguides and is electrically connected to the circuit block.

In one embodiment, an optical interconnection unit, which is three-dimensionally integrated and is arranged near the circuit blocks by bonding or adhesion, enables it to convert input-output signals from electric signals into optical signals, or to convert the input-output signals from optical signals into electric signals. In one embodiment, the use of the optical interconnection unit and the optical waveguide achieves very fast data transmission among the circuit blocks. In one embodiment, the optical interconnection unit is enabled to be small in shape, which has a cross-section of several hundreds of μm square or less and a thickness of several tens of μm or less, and the optical waveguides is also enabled to be compact, thereby enabling it to provide a compact system that implements faster signal processing than that of the related art.

Preferably, the optical interconnection unit is electrically connected to the circuit blocks in the optical interconnection system of one embodiment. In one embodiment, an optical interconnection unit is capable of converting electrical signals of circuit blocks to optical signals, thereby enabling data to be fast transmitted among the circuit blocks through the optical interconnection unit and waveguides.

In one embodiment, an optical interconnection unit having a light-emitting function or a light-receiving function is three-dimensionally integrated to be arranged at a predetermined position on a circuit block by bonding or adhesion, thereby providing a more compact configuration.

In one embodiment, a circuit block and an optical interconnection unit can be electrically connected to each other with metal interconnections and electrodes inside the circuit block, and do not need to form metal interconnections and electrodes outside the circuit block, thereby enabling it to employ a simple manufacturing process. Preferably, at least a portion of the optical waveguide is provided as to overhang the optical interconnection unit in the embodiment.

In one embodiment, all light beams emitted from an optical interconnection unit with a light-emitting-function can enter optical waveguides, and the light beams transmitting through the optical waveguides can enter an optical interconnection unit with a light-receiving function. Thus, the embodiment achieves the optical interconnection system with a simple configuration that is easy to manufacture.

Preferably, at least a portion of the optical interconnection system is provided on an upper surface of the circuit block. In one embodiment, when an optical interconnection unit is attached to each circuit block, optical interconnection units are enabled to be connected to each other with one optical waveguide. Thus, the embodiment achieves an optical interconnection system with a simple configuration that is easy to manufacture. Preferably, at least a portion of the optical waveguide is provided on the circuit block as to pass over the circuit block in the optical interconnection system of the embodiment.

In one embodiment, an optical waveguide is enabled to be provided on an integrated circuit chip regardless of whether or not the optical waveguide is on circuit blocks, thereby enabling it to shorten a path length of the optical waveguide. Preferably, at least a portion of the optical waveguide is provided on the circuit block as to bypass the circuit block in the optical interconnection system of the embodiment. In one embodiment, providing optical waveguides such that the optical waveguides bypass a circuit-block region enhances optical-coupling efficiency when an integrated circuit chip has a comparatively large difference in level on a boundary between the circuit-block region and a non-circuit-block region thereon.

Preferably, the circuit block includes any one of analog circuits, such as CPU (MPU), a memory circuit, DSP, an RF amplifying circuit, etc., and an image sensor in the optical interconnection system of the embodiment. In one embodiment, a signal transmission speed between CPU and memory devices is enabled to be tremendously improved. The speed is a bottle neck in high-speed information processing in a computer system of the related art.

One embodiment enables it to replace a configuration of the related art, where many metal interconnections make up a buss between CPU and memory circuits, with an optical waveguide and an optical interconnection unit. Thus, the embodiment provides a more compact and high-performance computer system than a one-chip computer of the related art. Preferably, the optical waveguides make up a transmission line for data signals or clock signals in an optical interconnection system of the embodiment. In one embodiment, fast transmission of data signals and clock signals is achieved by a compact configuration.

Preferably, the optical interconnection units are provided to one circuit block, and the waveguides are each provided to the optical interconnection units in the optical interconnection system of the embodiment. In one embodiment, input-output signals are transmitted in parallel to one circuit block with a plurality of sets of optical interconnection units and optical waveguides.

Thus, the embodiment enables it to further increase a transmission speed at which signals transmit between circuit blocks. Preferably, the integrated circuit chips are mounted on a substrate, and are optically connected to each other at least through an optical interconnection unit having light-emitting and light-receiving functions and an optical waveguide in the optical interconnection system of the embodiment.

In one embodiment, a large-scale computer system including integrated-circuit chips or an electrooptical system is compactly configured to achieve fast operation. Preferably, the integrated-circuit chips are mounted on the substrate, arranged closely to each other, and optically or electrically connected to each other in the optical interconnection system of the embodiment. In one embodiment, the integrated-circuit chips are mounted on the substrate, and arranged such that the sides of the integrated-circuit chips are closely-attached to each other, thereby enabling it to optically or electrically connect the integrated-circuit chips to each other in a simple way. In one embodiment, fast signal transmission not only for inter-chip signals but also for connecting integrated circuits to each other is enabled by optical signals or electrical signals, thereby achieving fast operation and compactness of a large-scale computer system including integrated-circuit chips. In one embodiment, an electrooptical system includes the optical interconnection system. In one embodiment, an electronic device includes the optical interconnection system.

In one embodiment, a module with CPU and memory circuits connected to each other by the optical interconnection system is provided to the electronic device, thereby enabling it to provide a compact and high-performance electronic device, which is capable of signal processing at a higher speed than a device in the related art.

According to an embodiment, an optical interconnection device includes a light-emitting element, a light-receiving element, and an optical waveguide. Both the light-emitting element and the light-receiving element have a layered structure. At least a portion of the light-emitting element is embedded in an insulator, and at least a portion of the light-receiving element is embedded in the insulator. The optical waveguide is formed over the insulator, and is optically coupled to the light-emitting element and the light-receiving element by distributed coupling.

According to another embodiment, a method of manufacturing an optical interconnection device includes bonding an epitaxially grown layer formed on a semiconductor to a silicon substrate, the epitaxially grown layer being to form a light-emitting element and a light-receiving element; removing the semiconductor substrate; forming the light-emitting element and the light-receiving element; covering over both the light-emitting element and the light-receiving element with an insulator layer or an organic layer; planarizing the insulator layer or the organic layer by polishing; forming an optical waveguide on the polished insulator or the polished organic layer; and providing electrodes to the light-emitting element and the light-receiving element.

According to another embodiment, an optical interconnection device includes a silicon oxide layer, a silicon-oxynitride waveguide, and a silicon waveguide. The silicon oxide layer is formed on a silicon substrate. The silicon-oxynitride waveguide is formed on the silicon oxide layer. The silicon waveguide is formed on the silicon-oxynitride waveguide, and includes a taper structure whose leading edge is thinly tapered. The taper structure is provided to one end or both ends of the silicon waveguide. In addition, light transmitting through the silicon waveguide is coupled to the silicon-oxynitride waveguide through the taper structure, or light transmitting through the silicon-oxynitride waveguide is coupled to the silicon waveguide through the taper structure.

An optical waveguide with a small bend radius is formed by using a substrate including a silicon single crystal to be subjected to heat treatment at temperatures of 500° C. to 1350° C. The heat treatment improves unevenness of the sidewalls of the optical waveguide, or makes a silicon waveguide single-crystalline.

In accordance with the embodiments described above, the light-emitting element is formed on a Silicon substrate, thereby enabling the light-emitting element to efficiently remove heat generated therein and to stably operate. A layer for the light-emitting element and the light-receiving element is enabled to be formed with just one step of epitaxial growth. The light emitting-element and the light-receiving element are formed by wafer bonding. Accordingly, no more steps are needed, thereby facilitating a manufacturing process of the light emitting-element and the light-receiving element. The light-emitting element and the light-receiving element can be formed with compound semiconductors, thereby achieving high luminance efficiency and low energy consumption. Lateral alignment of the light-emitting element, the light-receiving element, and the waveguide is achieved with an accuracy of lithography, and vertical control thereof is achieved with an accuracy of deposition and polishing, thereby enabling the alignment to be well controlled and the efficient optical coupling between the light emitting element, the light receiving element, and the waveguide.

In accordance with the embodiment, an amorphous silicon waveguide is used for a portion of the waveguide with a small bend radius or a portion thereof coupling to the light-emitting and light-receiving elements whereas a low-loss silicon-oxynitride waveguide is used for a straight-line long portion with a length of several tens of cm, thereby achieving a low-cost and low-loss optical interconnection device. The embodiment improves surface roughness of sidewalls of the optical waveguide to provide a low guide loss to the optical waveguide, thereby enabling it to manufacture a small-size optical interconnection device, a small-size optical unit, and a small-size optical module. Specific examples will be described below with reference to drawings.

First Example

Figure 1B:
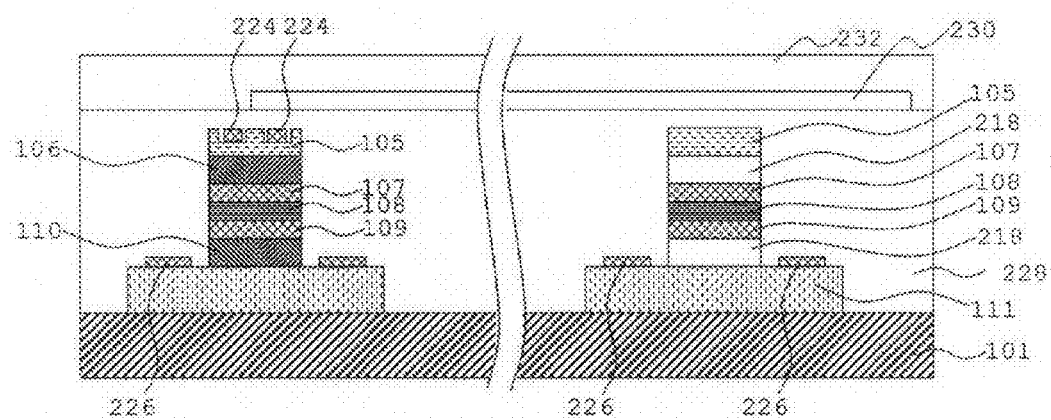
FIG. 1B is a cross-sectional view showing a cross section cut along the A-A' line of FIG. 1A.
Figure 2:
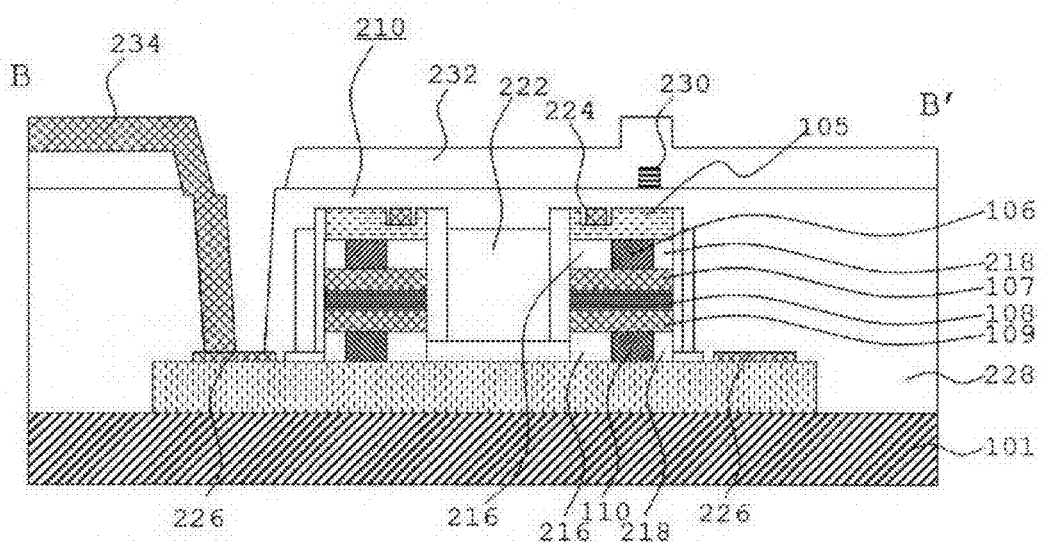
FIG. 2 is a cross-sectional view showing a cross-section cut along the B-B' line of FIG. 1A.

FIG. 1A is an upper view showing an optical interconnection device in accordance with a first example. FIG. 1B is a cross-sectional view showing a cross section cut along the A-A' line of FIG. 1A. FIG. 2 is a cross-sectional view showing a cross-section cut along the B-B' line of FIG. 1A.

A laser shown on the right side of FIG. 1B and an optical waveguide shown in FIG. 2 will be described. As shown in FIG. 2, a laser region (a light-emitting element) 210 is included in an optical interconnection device of the example and is formed in a ring. The ring laser (the light-emitting element) 210 includes a compound-semiconductors ring laser, which includes a p-GaAs contact layer 111, an $Al_xGa_{1-x}As$ clad layer 110, a GaAs optical confinement layer 109, an AlGaAs/GaAs multiquantum well layer 108, a GaAs optical confinement layer 107, an $Al_yGa_{1-y}As$ clad layer 106, and an n-GaAs contact layer 105, which are sequentially laminated on a substrate 101. The ring laser is embedded in a $SiO_2$ insulator layer 228. A p-type ohmic electrode 224 and an n-type ohmic electrode 226 are provided to the ring laser. An optical waveguide 230 of amorphous silicon is formed on the $SiO_2$ insulator layer 228. An insulation covering layer 232 is formed to cover the optical interconnection device as a whole.

In the example, the insulator is exemplified by $SiO_2$, but is not limited to this. Alternatively, polyimide or other publicly-known materials may be used as the insulator.

As shown in FIG. 1A, the optical waveguide 230 is formed over the ring laser 210 and an optical power detector (a light-receiving element) 240 through the $SiO_2$ insulator layer to make distributed coupling to the ring laser 210 and the light receiving element 240. The distributed coupling allows light emitted from the ring laser 210 to be coupled to the waveguide 230, to be subsequently transmitted to the detector 240, and to be finally received by the detector 240.

Figure 3:
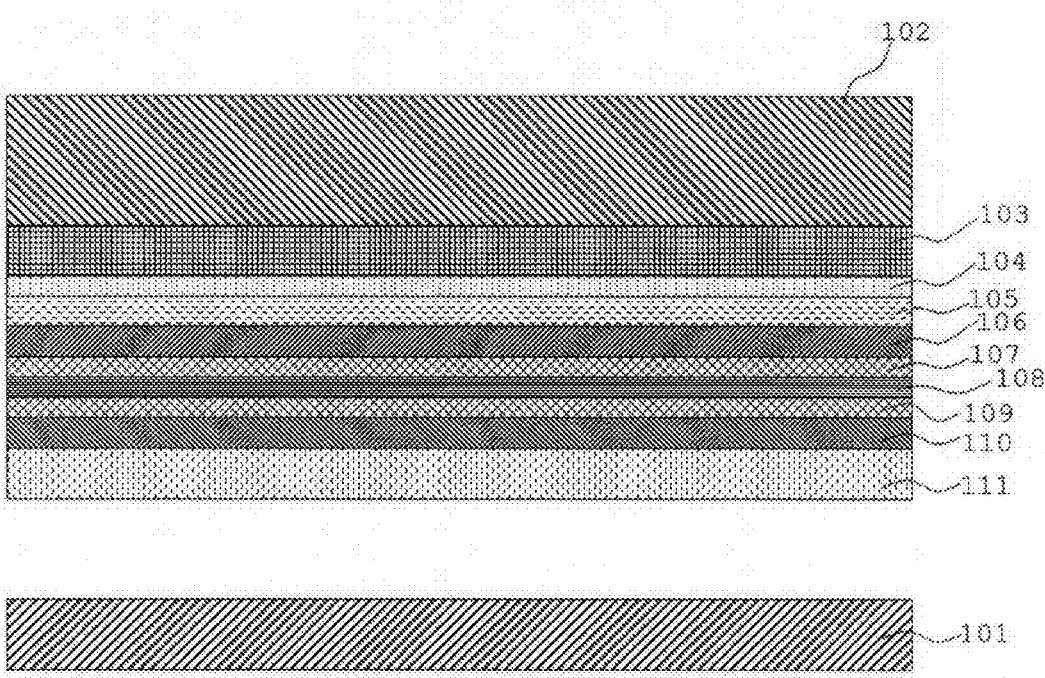
FIG. 3 is a sectional view showing process steps for manufacturing the optical interconnection device of the first example.

Such an element structure is achieved by process steps cross-sectionally shown in FIGS. 3 to 9. As shown in FIG. 3, a 0.5-µm thick n-GaAs buffer layer 103 and a 0.1-µm thick n-AlGaAs etch stop layer 104 are formed over the n-GaAs substrate 102 by an MOCVD (Metal Organic Chemical Vapor Deposition) method. Subsequently, a 0.01-µm thick n-GaAs contact layer 105, an $n-Al_{0.92}Ga_{0.08}As$ clad layer 106, an n-GaAs optical confinement layer 107, an undoped multiquantum-well active layer 108, a p-GaAs optical confinement layer 109, a $p-Al_{0.92}Ga_{0.08}As$ clad layer 110, and a 0.01-µm thick p-GaAs contact layer 111 are in sequence formed.

The multiquantum-well active layer 108 not shown in FIG. 3 includes a structure with three 8-nm-thick n-GaAs quantum well layers, each being sandwiched between two 10 nm-thick AlGaAs barrier layers, and the whole structure are sandwiched between two 40-nm-thick $Al_{0.1}Ga_{0.9}As$ layers. Alternatively, an AlGaAs graded layer may be laid between the GaAs contact layer 105 and the GaAs clad layer 106, or between the GaAs clad layer 106 and the undoped multiquantum-well active layer 108. The Al composition of the AlGaAs graded layer may be controllably changed from 0.1 to 0.92.

The p-GaAs contact layer 111 and the silicon substrate 101 are bonded (FIG. 3). The process for the bonding involves exposing two surfaces of the p-GaAs contact layer 111 and the silicon substrate 101 to oxygen or argon plasma, which is followed by making the two surfaces in contact with each other in a vacuum. Such a contact of the two surfaces with each other in the vacuum provides sufficient bonding strength. In order to obtain higher bonding strength, the two surfaces bonded may be heat-treated under load. For example, the two surfaces bonded may be heat-treated at 150° C. for 2 hours under a load of 5 MPa.

Surface flatness of the silicon substrate and the epitaxially grown layer is important in the above-mentioned bonding process. Preferably, the two surfaces are subjected to chemical mechanical polishing (CMP) in order to obtain such surface flatness. Surface protrusions are often created on a surface of an epitaxially grown GaAs layer as a result of anomalous growth. When the hardness of the surface protrusions differs from the hardness of the matrix area of the GaAs layer, the surface protrusions make it difficult to obtain a flat surface by CMP. In such a case, the whole surface of the GaAs layer may be covered with polycrystalline silicon or amorphous silicon, and the polycrystalline silicon or the amorphous silicon may be polished by CMP, thereby providing a flat surface to the GaAs layer. Bonding the silicon substrate to the polycrystalline silicon or the amorphous silicon will be performed in this case. The above-mentioned plasma exposure will be used for the bonding.

Figure 4:
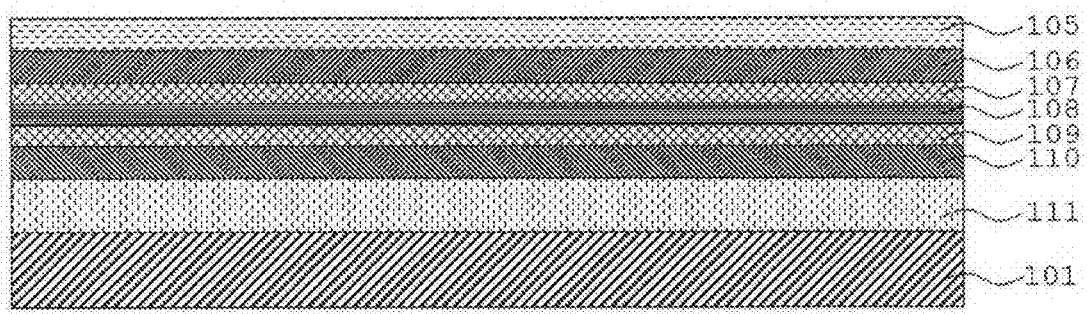
FIG. 4 is a sectional view showing process steps for manufacturing the optical interconnection device of the first example.

The GaAs substrate 102 in the resultant bonded wafer is selectively removed until the AlGaAs etch stop layer 104 is exposed. Prior mechanical polishing by several tens of μm may be applied before the selective removing. A mixed solution of 28%-ammonia water and 35%-oxygenated water both being mixed at a volume ratio of 1:30 is used for the selective etching. After the GaAs etch stop layer 104 is exposed, the resultant wafer is immersed in 75° C.-hydrochloric acid to remove the GaAs etch stop layer 104. Removing the GaAs etch stop layer 104 causes the GaAs contact layer 105 to be exposed, thereby providing a compound semiconductor layer for forming light-emitting and light-receiving elements (FIG. 4).

Figure 5:
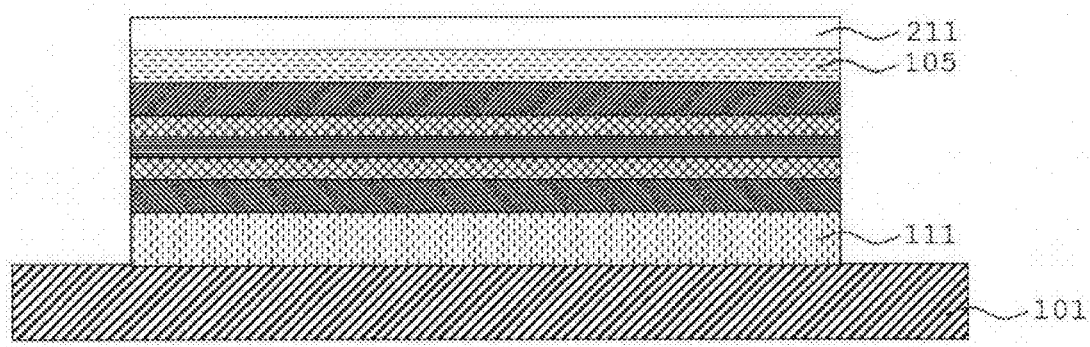
FIG. 5 is a sectional view showing process steps for manufacturing the optical interconnection device of the first example.
Figure 6:
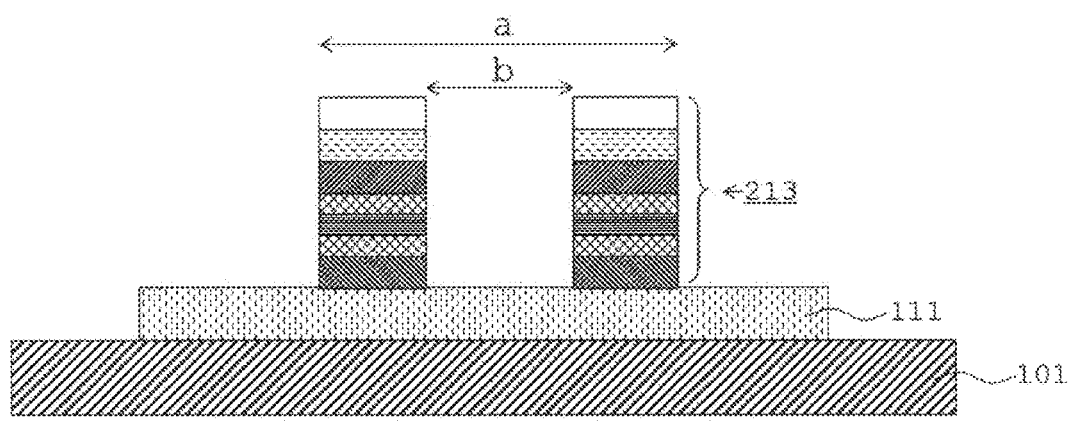
FIG. 6 is a sectional view showing process steps for manufacturing the optical interconnection device of the first example.
Figure 7:
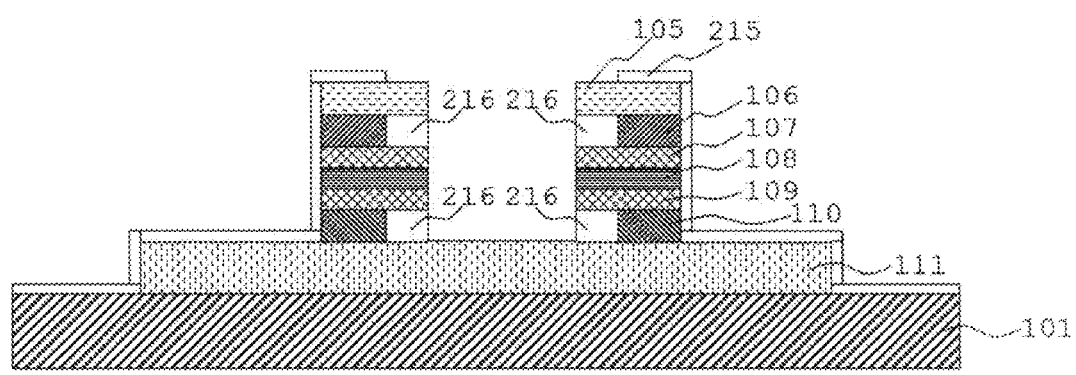
FIG. 7 is a sectional view showing process steps for manufacturing the optical interconnection device of the first example.

A method of manufacturing a ring laser in accordance with the example will be described. As shown in FIG. 5, a $SiO_2$ layer 211 is formed over the compound semiconductor layer, and a photoresist (not shown) is applied onto the $SiO_2$ layer 211 to be patterned. The photoresist patterned is used as a mask to process the $SiO_2$ layer 211 by dry etching. The resultant photoresist/$SiO_2$ layer is used as a mask to process a peripheral portion of the laser including contacts (FIG. 5). Subsequently, a contact layer 111 is remained to the ring laser region 210 by dry etching (FIG. 6). The outer and inner diameters of the ring structure are 20 μm and 15 μm, respectively. After a protective film 215 including $SiO_2$ is formed on the ring region except for the inner portion of the ring region, portions 216 in contact with inner circumferences of the AlGaAs clad layers 106 and 110 are selectively oxidized with a steam oxidation furnace (FIG. 7).

Figure 8:
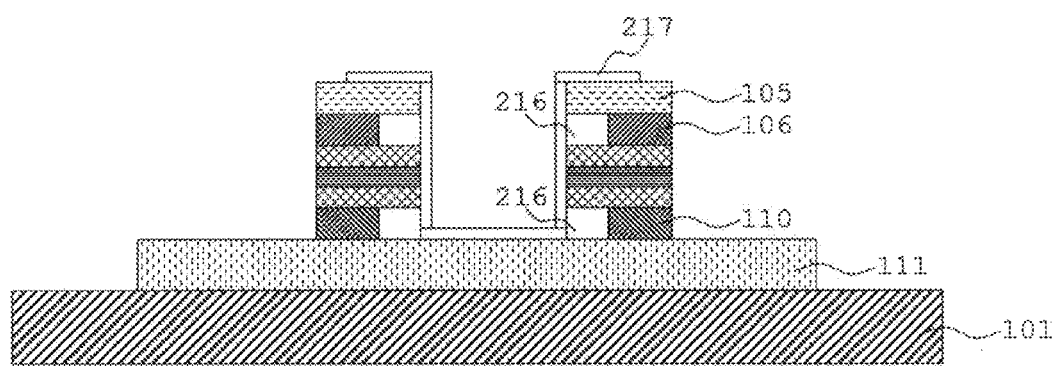
FIG. 8 is a sectional view showing process steps for manufacturing the optical interconnection device of the first example.
Figure 9:
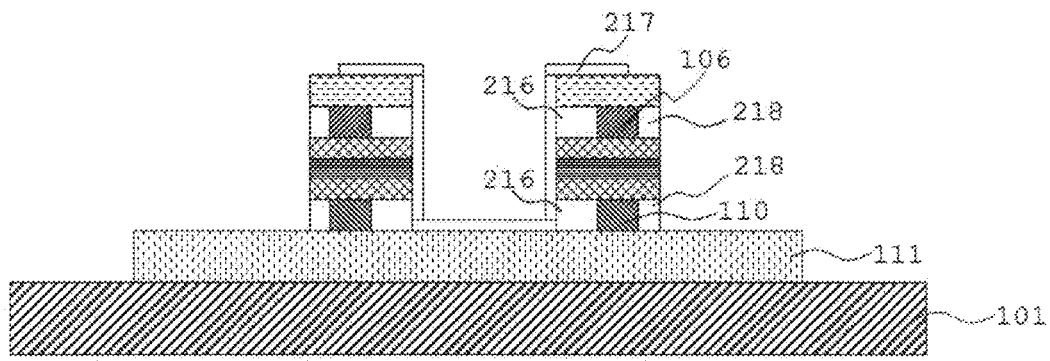
FIG. 9 is a sectional view showing process steps for manufacturing the optical interconnection device of the first example.
Figure 10:
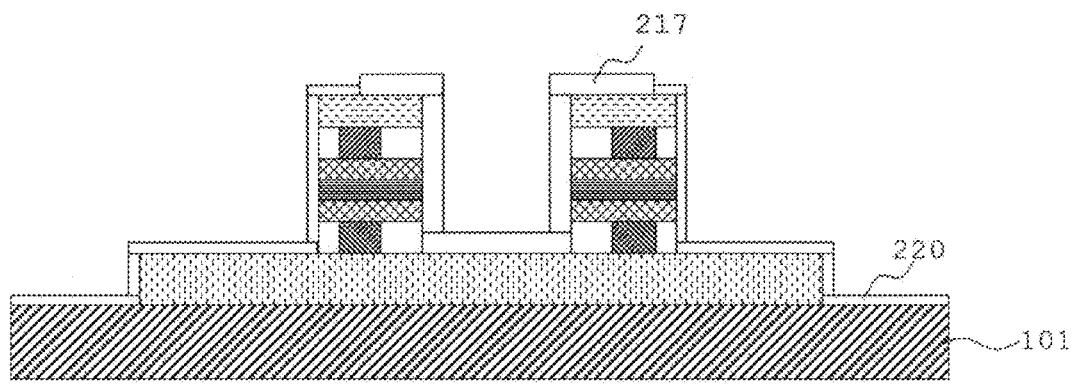
FIG. 10 is a sectional view showing process steps for manufacturing the optical interconnection device of the first example.

The protective film 215 is removed to form an inner protective film 217 of $SiO_2$ (FIG. 8). Subsequently, portions 218 in contact with outer circumferences of the AlGaAs clad layers 106 and 110 are selectively oxidized with a steam oxidation furnace (FIG. 9). After that, the resultant whole structure is covered with a $SiO_2$ layer 220 (FIG. 10).

In this way, modifying outer sides of the films by oxidation allows it to reduce influences of roughness and damage due to etching. A current constriction structure is simultaneously obtained, which enables it to selectively inject current into a region of the active layer having a circular mode, thereby increasing gain of the circular mode. Accordingly, the semiconductor laser having sufficient lasing property is obtained as a result of the circular outer shape.

Figure 11:
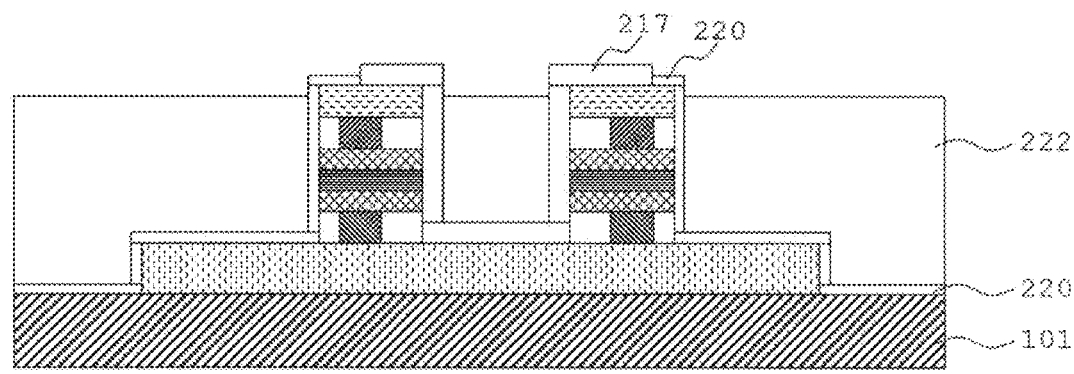
FIG. 11 is a sectional view showing process steps for manufacturing the optical interconnection device of the first example.
Figure 12:
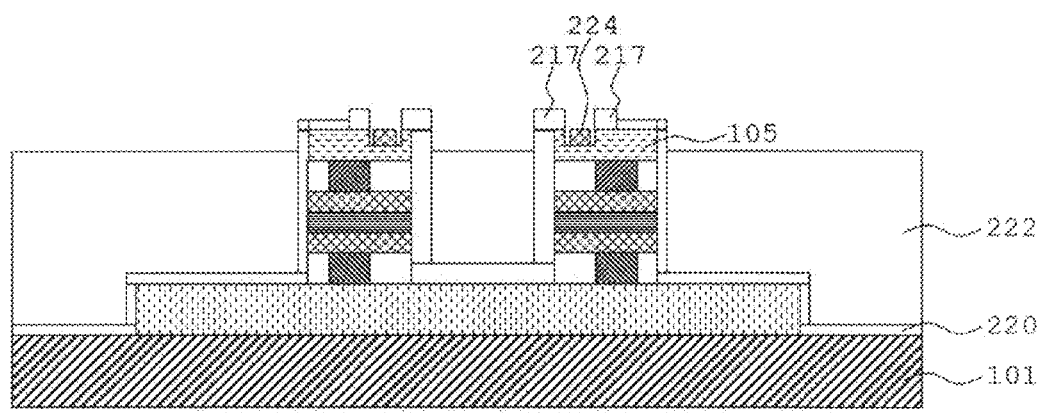
FIG. 12 is a sectional view showing process steps for manufacturing the optical interconnection device of the first example.

A polyimide 222 is used to expose an upper portion of the ring region and to planarize the remaining region. Such a structure is achieved by polyimide application and an etchback method (FIG. 11). A portion of a $SiO_2$ layer 217, which covers the exposed ring structure, is removed. The remaining $SiO_2$ layer is used as an etching mask to etch a portion of the contact layer 105. An AuGe alloy film and a gold film are in sequence deposited on the etched portion of the contact layer 115. Subsequently, the resultant structure undergoes liftoff processing. After annealing, an n-type contact 224 is formed (FIG. 12).

Figure 13:
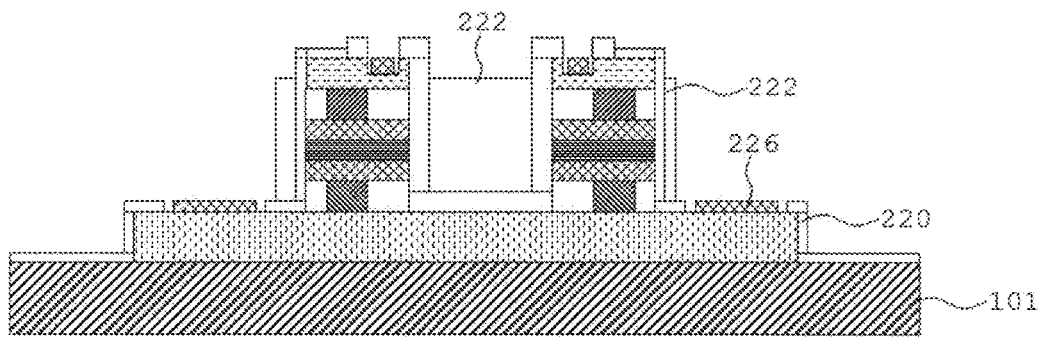
FIG. 13 is a sectional view showing process steps for manufacturing the optical interconnection device of the first example.
Figure 14:
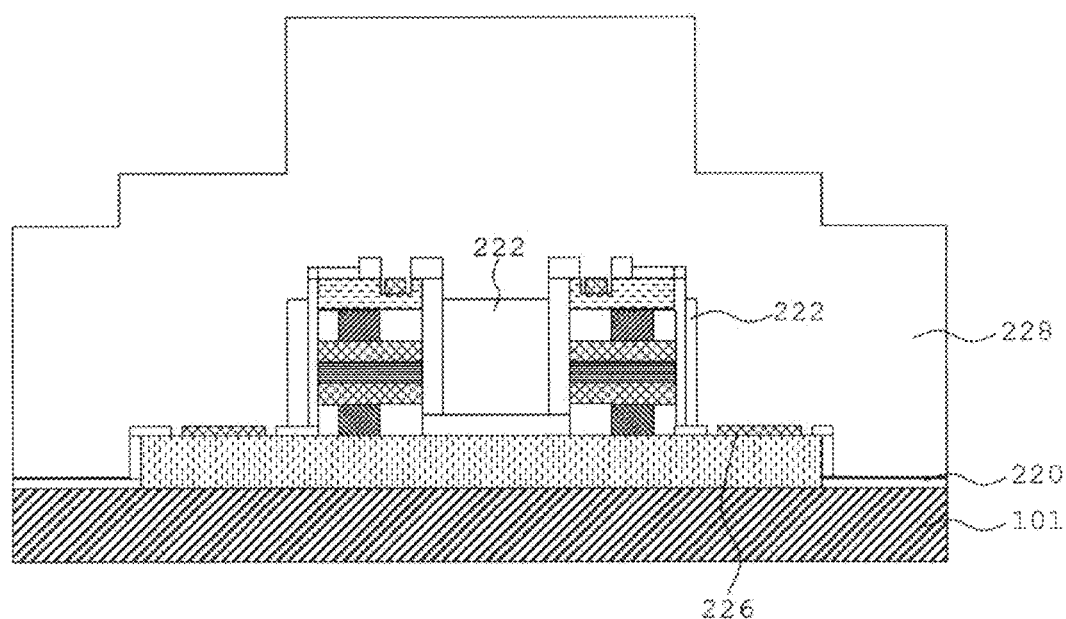
FIG. 14 is a sectional view showing process steps for manufacturing the optical interconnection device of the first example.

The polyimide 222 is removed by etching such that the polyimide 222 remains on the outer sidewall of the ring structure and inside the center thereof. After the $SiO_2$ layer 220 is patterned, Ti, Pt, and Au are deposited on the n-GaAs contact layer 111. A p-electrode 226 is formed by annealing (FIG. 13). The resultant whole structure is covered with a $SiO_2$ layer 228 (FIG. 14) to be planarized by CMP. Before CMP, however, the ring laser structure has unevenness of 1 μm or more, which makes it difficult to directly planarize the structure by CMP. Preferably, before CMP is performed, the unevenness is reduced as much as possible. In the example, the unevenness will be reduced as follows.

Figure 15:
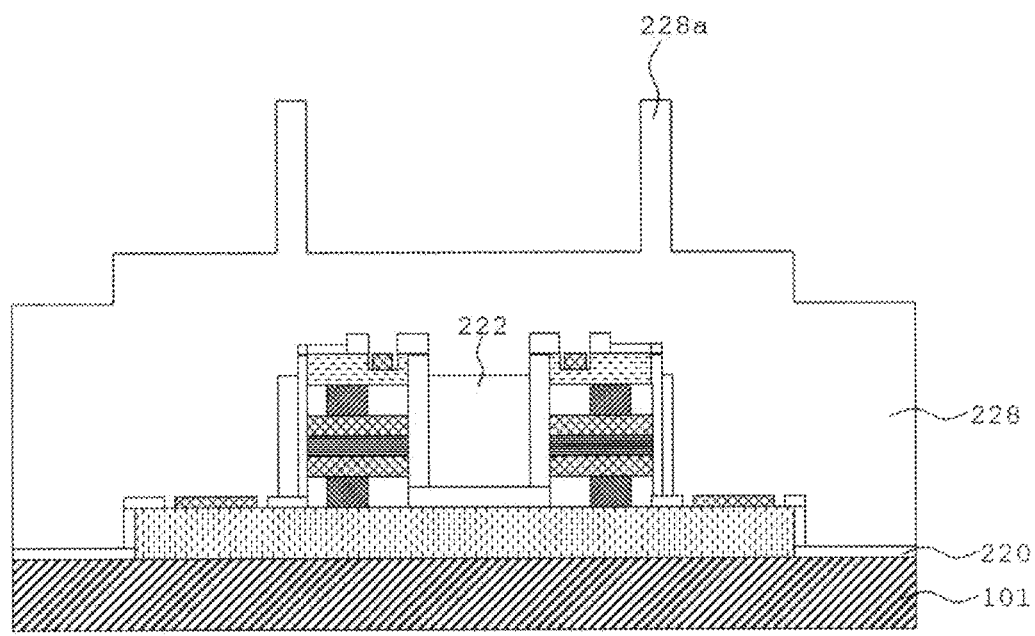
FIG. 15 is a sectional view showing process steps for manufacturing the optical interconnection device of the first example.
Figure 16:
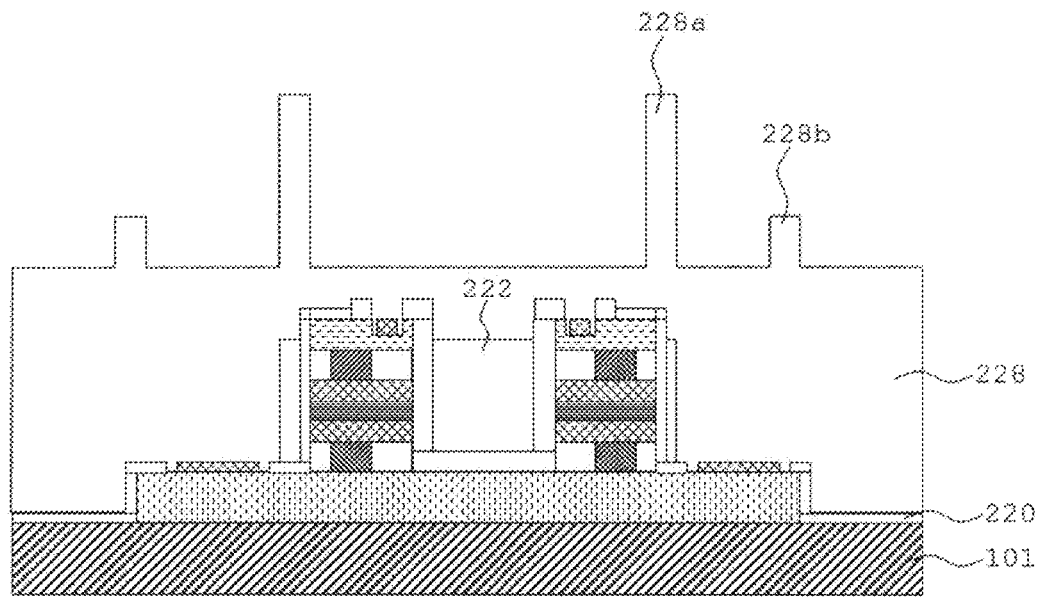
FIG. 16 is a sectional view showing process steps for manufacturing the optical interconnection device of the first example.

Photoresist is applied to the resultant structure as to except a convex portion of the $SO_2$ layer 228, which is resulted from the convex ring laser structure inside the ring-shaped p-electrode 226. The convex portion of the $SiO_2$ layer 228, which has not been covered with the photoresist, is etched to be dug down (FIG. 15). Although a transfer difference of the mask patterns gives rise to a convex portion 228a, the width of the convex portion 228a is so narrow that the convex portion 228a can be easily removed by CMP. Photoresist is further applied to the resultant structure as to except a convex portion of the $SiO_2$ layer 228, which is resulted from the ring-shaped p-electrode 226, and the exposed portion is subsequently etched to be dug down (FIG. 16). Although a transfer difference between the mask patterns gives rise to a convex portion 228b, the width of the convex portion 228b is so narrow that the convex portion 228a can be easily removed by CMP. Thus, the uneven surface of the $SiO_2$ layer 228 can be removed, except for the convex portions 228a and 228b both arising from the transfer difference between the mask patterns.

Figure 17:
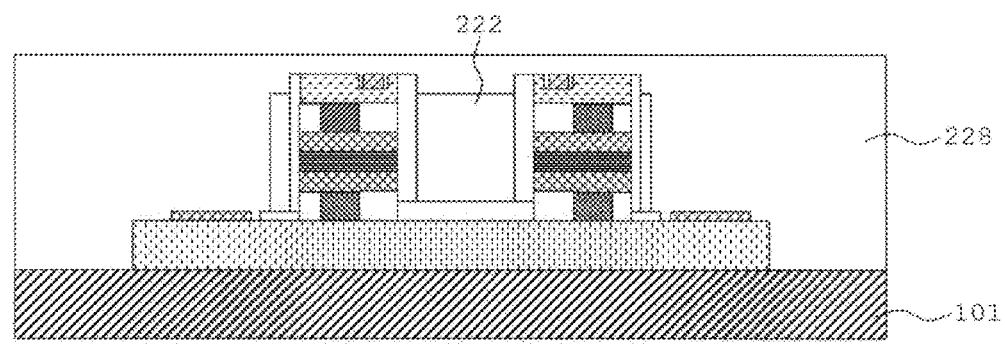
FIG. 17 is a sectional view showing process steps for manufacturing the optical interconnection device of the first example.

The mostly flat surface with reduced unevenness is subjected to CMP to provide a distance of 100 nm between the uppermost surfaces of the planarized $SiO_2$ layer 228 and the ring laser (FIG. 17). Preferably, the surface roughness of the $SiO_2$ layer 228 is 1 nm or less.

Figure 18:
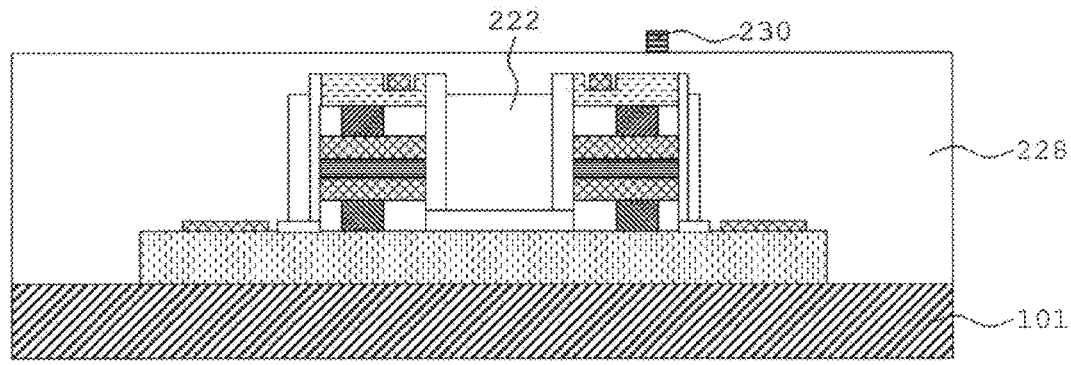
FIG. 18 is a sectional view showing process steps for manufacturing the optical interconnection device of the first example.
Figure 19:
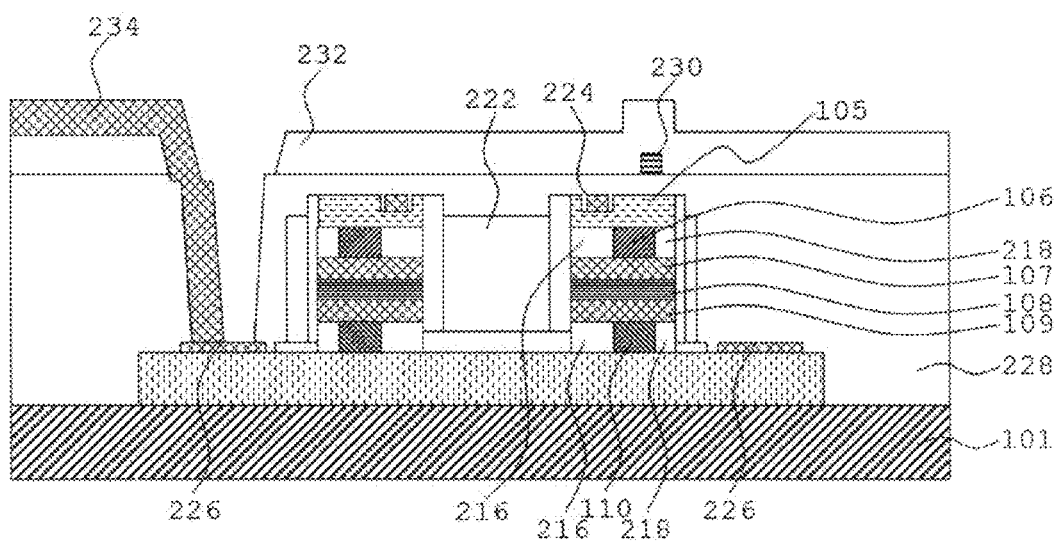
FIG. 19 is a sectional view showing process steps for manufacturing the optical interconnection device of the first example.

Amorphous silicon 200 nm is deposited on the surface of the $SiO_2$ layer 228 that has been subjected to CMP. Subsequently, a $SiO_2$ layer 60 nm is deposited on the amorphous silicon. The 200-nm-thick amorphous silicon is processed using the 60-nm-thick $SiO_2$ as a mask to manufacture an optical waveguide 230 (FIG. 18). After that, photosensitive polyimide 1 μm is applied to be patterned, thereby forming lead-out wiring 236 for the n-electrode (in FIG. 1) and lead-out wiring 234 for the p-electrode (FIG. 19).

Thus, the light-emitting element shown in FIG. 2 is formed. In the example, the p-electrode 226 is formed outside the ring structure. Alternatively, the p-electrode 226 may be formed inside the ring structure. Although the oxide layers are formed by a steam oxidation method to provide the current constriction structure and the optical confinement structure, the method of forming the oxide layers is not limited to the steam oxidation method. Alternatively, the oxide layers may be formed by proton ion implantation. The laser structure is not limited to the ring shape, but may be a disk shape.

Figure 20:
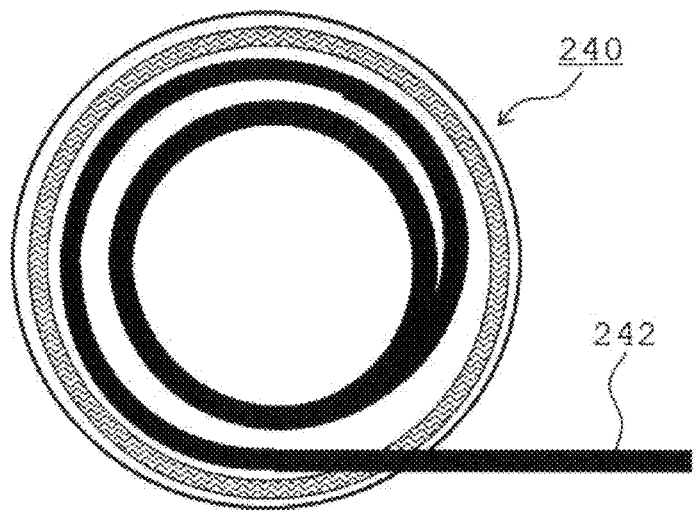
FIG. 20 illustrates a structure of the light-emitting element of the first example.

A light-emitting element of the example will be described below. FIG. 20 illustrates a structure of the light-emitting element. An optical waveguide 242 in a spiral is provided on the structure of the disk-shaped light-emitting element 240 of compound semiconductors. An optical signal, which has propagated through the optical waveguide 242, leaks to a light-absorbing layer of the light-receiving element to be absorbed by the light-absorbing layer and to be subsequently converted to an electric signal. Forming the light-receiving element in a disk shape causes a coupling length between the optical waveguide and the light-receiving element to be long while keeping a small element size.

As is clear from the cross-sectional structure, such a light-receiving element is achieved in the same way as the above-described method of manufacturing the light-emitting element. Alternatively, the light-receiving element may lack the current constriction structure where the both sides of the clad layers 160 and 110 are sandwiched between the selectively oxidized layers 216 and 218, as shown in FIG. 2.

Second Example

The first example has exemplified the direct bonding method or the method where polycrystalline Si or amorphous silicon is deposited on the epitaxially grown GaAs layer to be bonded to the silicon substrate. In contrast, a second example performs wafer bonding using metals.

The metals include copper, aluminum, and gold. The metals are deposited on the surface of the epitaxially grown layer by vacuum deposition or sputtering. Alternatively, a polycrystalline silicon film or an amorphous silicon film may be deposited on a conspicuously rough surface of the epitaxially grown GaAs layer to be subjected to CMP. The metals may be deposited on the polycrystalline Si or the amorphous silicon that have been already planarized by the CMP. After the metals are preliminarily deposited also on the surface of the silicon substrate, the surface of the metals on the silicon substrate is activated, e.g., by Ar plasma to be bonded to the epitaxially grown GaAs layer.

Alternatively, an alloy of gold and tin (AuSn) or an alloy of gold and In (AuIn) may be employed. When the AuSn alloy or the AuIn alloy is employed as one of the metals, heat treatment is employed instead of the surface activation by the Ar plasma. The AuSn alloy and the AuIn alloy are heat-treated at a temperature higher than 280° C. and 220° C., respectively, to be melted. Melting both alloys allows the wafer bonding. Preferably, the compound semiconductors are epitaxially grown on an InP substrate whose thermal expansion coefficient is less different than the thermal expansion coefficient of the silicon substrate. The compound semiconductors epitaxially grown on the InP substrate allows it to manufacture the elements of the example without departing from the scope of claims.

Third Example

When the epitaxially grown layer and the silicon substrate are bonded to each other to manufacture the elements, isolation of element is needed in some cases. The bonding using the metals electrically causes a short circuit condition. In addition, amorphous silicon and polycrystalline silicon make it more difficult to provide high resistance than crystalline silicon. In such cases, a method described below enables it to electrically isolate elements from each other.

In a third example, the wafer bonding and the etching of the compound semiconductor to form the peripheral portion of elements including the contacts are successively followed by dry etching with chlorine-based gases to etch the amorphous silicon, polycrystalline silicon, and metal layers. Etching electivity between the photoresist and the metal layer is not so high that the photoresist is subjected to multiple patterning. The peripheral portion is not so fine that the multiple patterning cause negligibly small influence due to positional misalignment. The low resistance layers are etched until the silicon substrate having high resistance is exposed, thereby enabling it to electrically isolate elements from each other.

Fourth Example

Figure 21A:
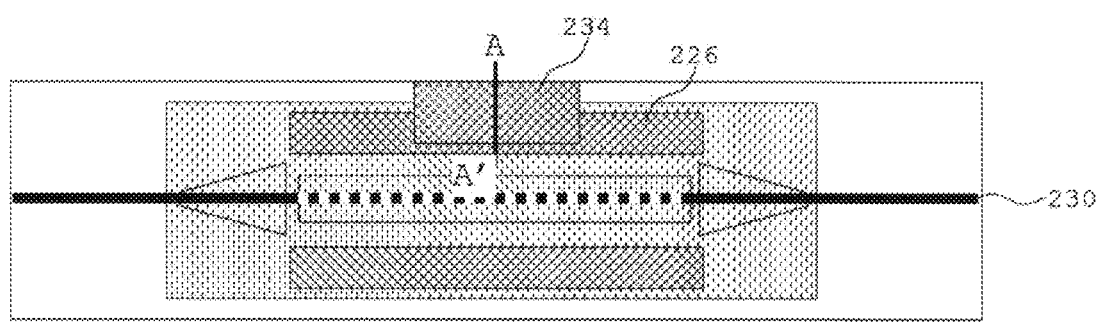
FIG. 21A is a top view showing an optical interconnection element of a fourth example.
Figure 21B:
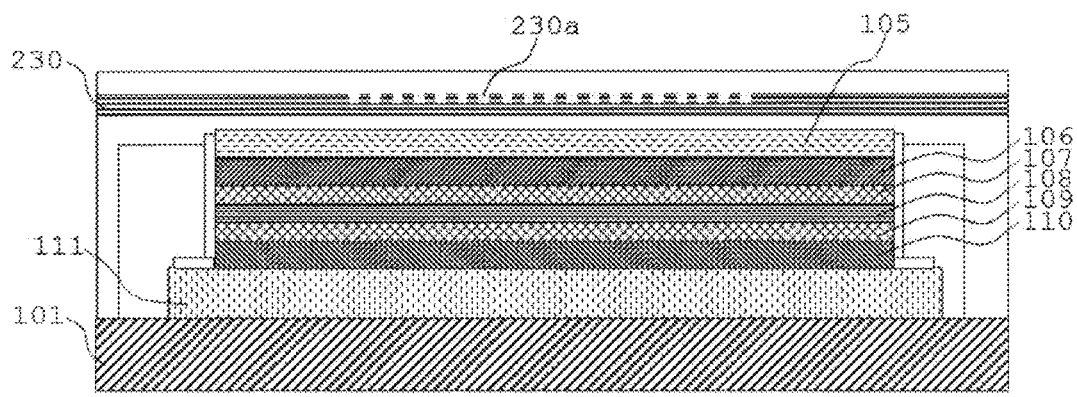
FIG. 21B and FIG. 21C are a cross-sectional view showing a cross-section cut along an optical waveguide 230 and the A-A' line of FIG. 21A.
Figure 21C:
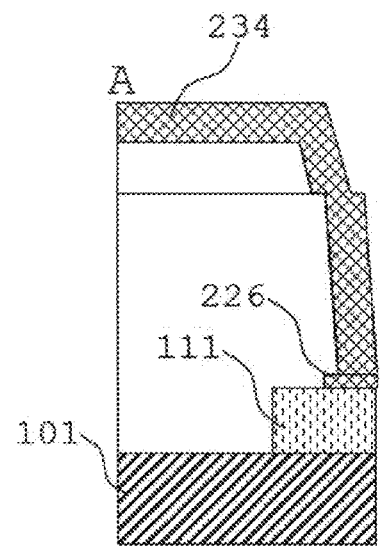

The above examples have been described with the ring-type light-emitting element and light receiving element. Alternatively, the light-emitting and light receiving elements may be disk-shaped or linear. FIGS. 21A and 21B exemplify a linear light-emitting element employing a DFB laser. FIG. 21A is a top view showing an optical interconnection element of a fourth example. FIG. 21 C is a cross-sectional view showing a cross-section cut along the A-A' line of FIG. 21A (in a longitudinal direction of a silicon waveguide).

Light sources for the optical interconnection device include a distributed feedback laser. The distributed feedback laser operates in a single longitudinal mode, and achieves a stable light-signal transmission with low noise and without mode hopping at a fast modulation. A grating 230a is formed by etching a portion or entirety of a silicon waveguide 230 formed on the compound semiconductors. After the deposition of the waveguide, a pattern of the grating 230a is drawn by EB exposure, and the pattern is formed by subsequent dry etching. The dimension and etched depth of the grating is determined by an oscillation wavelength and a coupling degree of distributed feedback. The order of the pattern may be first, second, or higher. The end of the element is tapered so that a portion terminating the compound semiconductors causes no light reflection.

Figure 22:
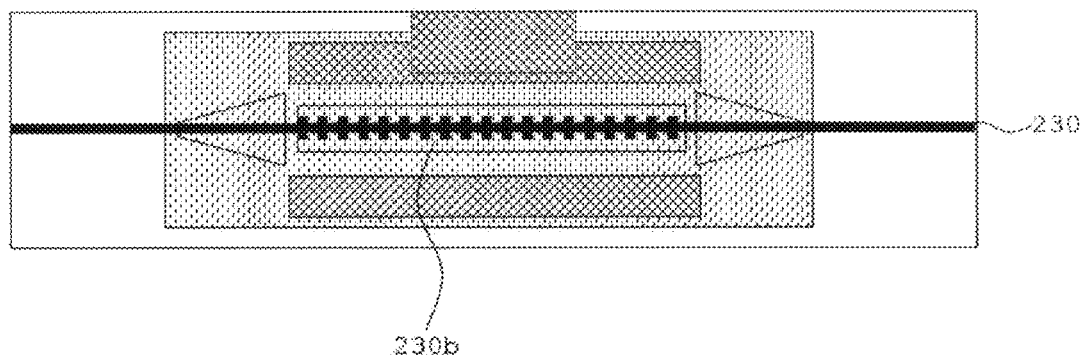
FIG. 22 is a top view showing another optical interconnection element of the fourth example.
Figure 23:
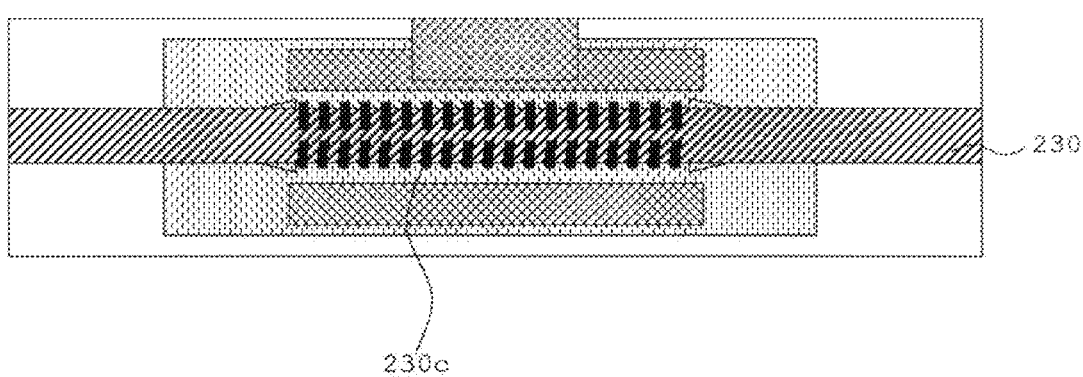
FIG. 23 is a top view showing another optical interconnection element of the fourth example.

In the example, the shape of the grating is illustrated by a structure that is obtained by etching the silicon waveguide. Alternatively, the shape may be of refractive index coupling type 230b, where the width of the silicon waveguide is periodically modulated as shown in FIG. 22. Alternatively, the shape may be of gain or loss coupling type 230c, where the metal structures are periodically arranged as shown in FIG. 23. The material of the waveguide is assumed to be silicon in the example. Alternatively, the material of the waveguide may be SiN, SiON, polymer, or compound semiconductors including InP and GaAs.

The light-receiving element is not limited to the ring type or the disk type, but may be linear. In addition, the light-receiving element does not need the above-mentioned grating structures.

Fifth Example

Figure 24:
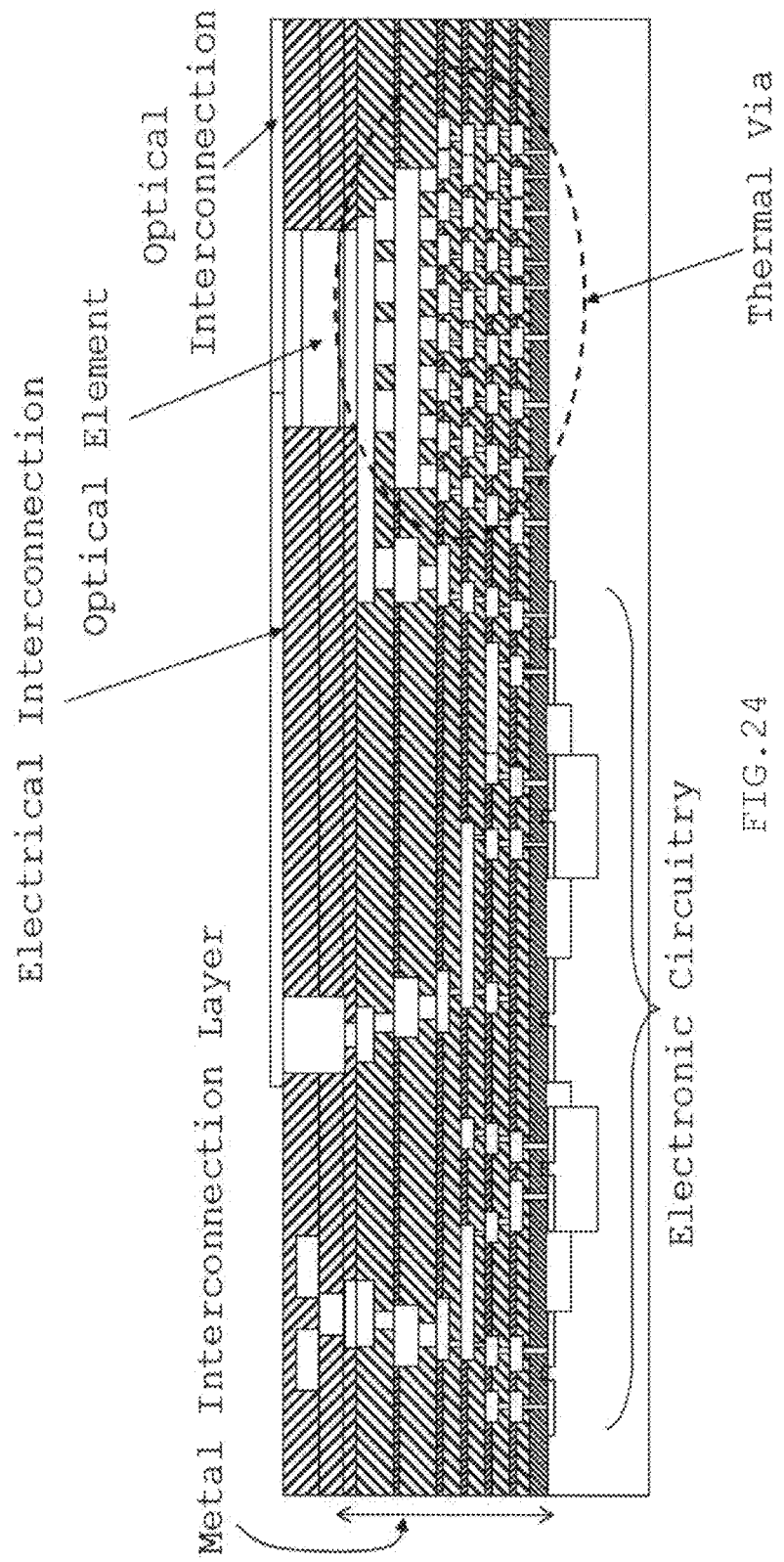
FIG. 24 illustrates a cross-section of an optical interconnection device formed on a substrate in which circuitry is formed.

An optical interconnection device can be formed also on a substrate in which circuitry has been formed. FIG. 24 illustrates a cross-section of an optical interconnection device formed on a silicon substrate in which circuitry has been formed. Metal interconnections are formed on the silicon substrate including formed FETs. The optical interconnection device includes a light-emitting element, a light-receiving element, and an optical waveguide over the metal interconnections. The electronic circuitry is to drive the light-emitting element, or to convert optical current into voltage signals to be amplified by the circuitry. The electronic circuitry is connected to the light-emitting element and the light-receiving element through metal interconnections. A metal structure (referred to as a thermal via) is provided to release heat generated at the light-emitting and light-receiving elements. The thermal via connects the elements and the silicon substrate with a metal interconnection. Releasing the heat allows the optical interconnection device to keep the stability thereof at high-temperature operation and high-power operation. Alternatively, the thermal via may share a metal interconnection that transmits normal electric signals to the light-emitting and light-receiving elements, or may be laid separately. Two or more metal interconnection layers are laid in FIG. 24, but the number of the layers being laid is not limited to the number specified in FIG. 24. The size and number of the thermal vias are determined by a design rule in the process of forming the electronic circuitry.

Sixth Example

An optical interconnection device in accordance with a sixth example, to which amorphous silicon and silicon-oxynitride waveguides are integrated, will be described in detail below.

Figure 25:
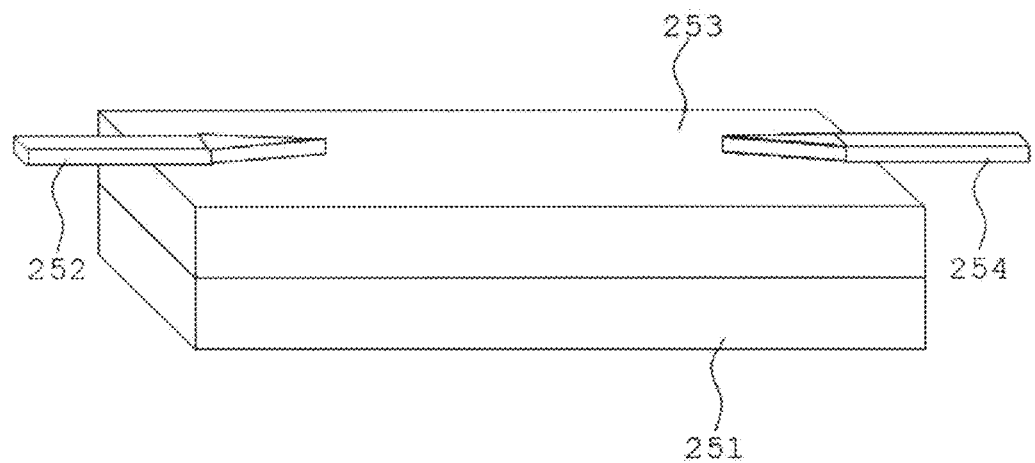
FIG. 25 is a schematic view showing an optical waveguide device of a sixth example.
Figure 26:
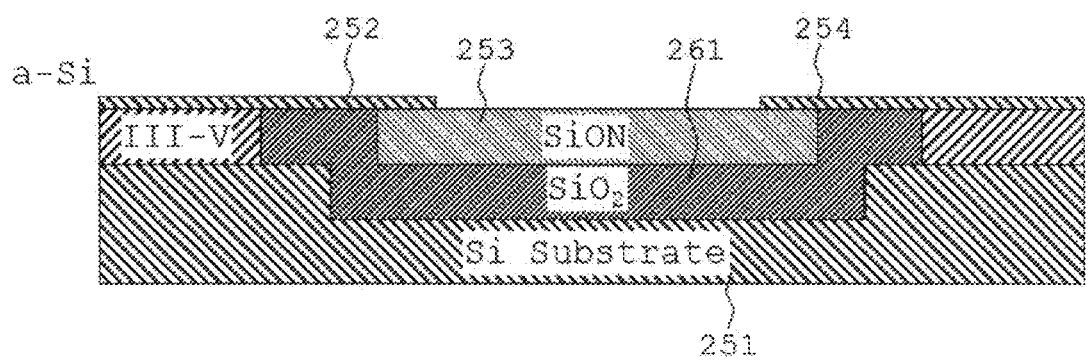
FIG. 26 is a cross-sectional view showing a substantial portion of the optical waveguide device of the sixth example.

FIG. 25 is a schematic view showing an optical waveguide device, and is also a diagrammatic perspective view showing a substantial portion of the optical waveguide device for silicon optical interconnections. In FIG. 25, an input waveguide 252 and an output waveguide 254 includes an amorphous silicon measuring 450 to 600 μm wide by 200 to 300 nm thick, and leading edges thereof are processed in a tapered shape with an edge width of 100 to 200 nm and a taper length of 200 to 300 μm. The waveguide 253 including a silicon oxynitride measures 3 to 4 μm wide by 1.5 to 2 μm thick. The front side, back side, lateral sides, and underside of the waveguide 253 are covered with a thick silicon oxide. The silicon oxynitride has a refractive index that is different from that of a silicon oxide by 2%. FIG. 26 is a cross-sectional view showing a substantial portion of the optical waveguide device shown in FIG. 25. As shown in FIG. 26, the waveguide structure is formed as follows. A thick silicon oxide 261 is deposited over the silicon substrate 251 having a concave to be filled with the thick silicon oxide 261. A silicon oxynitride layer 253 is deposited by thermal CVD onto the thick silicon oxide 261 that has been planarized. Subsequently, thin amorphous silicon layers 252 and 254 are grown thereover. The waveguide structure is formed by dry etching.

The wavelength of light propagating through the waveguide is 1.3 to 1.6 μm. The coupling efficiency between the waveguides 252 and 253 is 1 dB or less, and the coupling efficiency between the waveguides 253 and 254 is also 1 dB or less. The silicon waveguide has a loss of 1 dB/cm or less, and the silicon oxynitride waveguide has a loss of 2 dB/cm or less. As a result, optical signals can be transmitted with a low loss from a light-emitting element through a distance of several tens of cm or more, and be well detected by a light-receiving element.

Seventh Example

Figure 27A:
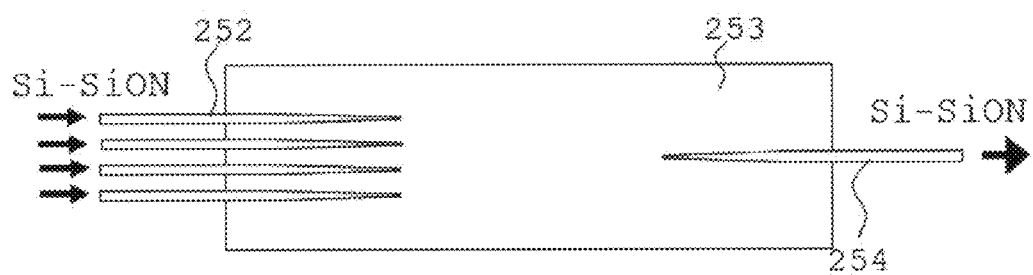
FIGS. 27A to 27D are top views showing outlines of various optical waveguides in accordance with a seventh example.
Figure 27B:
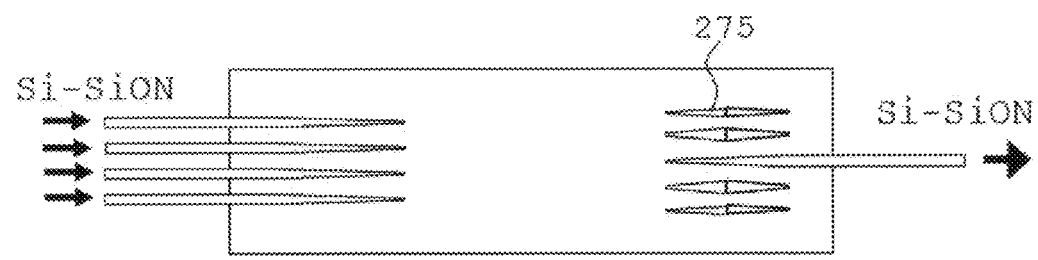
Figure 27C:
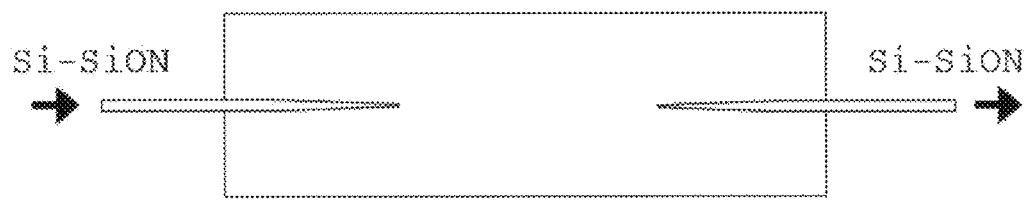
Figure 27D:
Figure 28A:
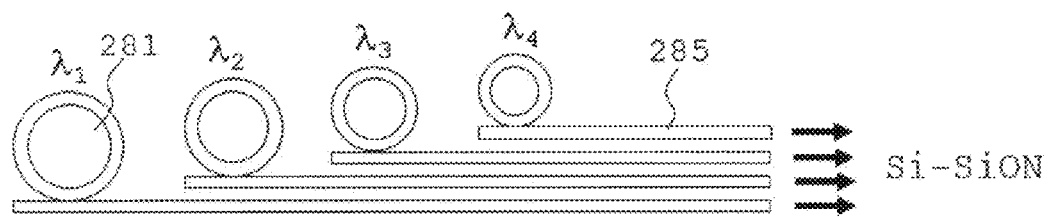
FIGS. 28A and 28B are schematic views showing positional relations between the waveguide and an optical receiver in accordance with the seventh example.
Figure 28B:
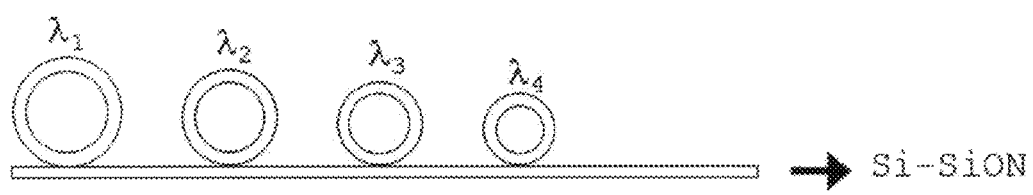
Figure 29:
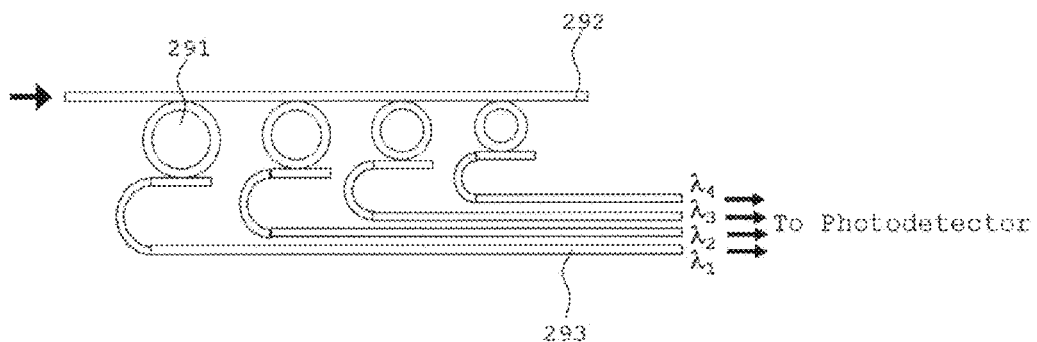
FIG. 29 is a schematic view showing a combined structure of a light source and the optical waveguide in accordance with the seventh example.

FIGS. 27A to 27D are top views showing outlines of various optical waveguides in accordance with a seventh example. FIGS. 28A and 28B are schematic views showing positional relations between a waveguide and an optical receiver. FIG. 29 is a schematic view showing a positional relation between a waveguide and an optical receiver. As shown in FIG. 28A, four sources of ring laser diodes with different diameters are coupled to the respective ends of four output silicon waveguides, and emit four light beams with different wavelengths of λ1, λ2, λ3, and λ4 to carry 4-channel optical signals by modulating the respective light beams directly. The output signals are supplied to the respective silicon waveguides 285. As shown in FIGS. 27A to 27D, the ends 252 of the respective silicon waveguides are connected to one end of the SiON waveguide 253 having a length of several tens of cm, and the other leading edges are thinly tapered to convert a light beam into a spot-size beam. Optical signals are transmitted by the four silicon waveguides 252 to input sides of the SiON waveguide 253. The optical signals are coupled to the SiON waveguide 253 at the entrances, and are further transmitted as a 4-wavelength multiplexing signal through a distance of several tens of cm. The other end (output side) of the SiON waveguide 253 is connected to one silicon waveguide 254. A leading edge (one end) of the silicon waveguide 254 is thinly tapered at the connection to the silicon waveguide 254 (FIG. 27A). As shown in FIG. 29, the 4-wavelength multiplexing signal from the other end of the silicon waveguide 254 is transmitted to a silicon waveguide 292 that is coupled to 4-ring wavelength filters 291 with four diameters different from each other. The 4-ring wavelength filters separate the 4-wavelength multiplexing optical signal into four separate signals having a wavelength of λ1, λ2, λ3, or λ4. The four separate signals are transmitted to four silicon waveguides 293 at each one end of the silicon waveguide 293. The four silicon waveguides 293 each include a curved waveguide portion. The 4 separate signals are received by each light-receiving element (for example, a spiral PD) to be converted into corresponding electric signals.

In FIG. 27A, the output side of the SiON waveguide 253 is connected to the silicon waveguide through a spot-size converter including a tapered waveguide. Alternatively, as shown in FIG. 27B, the output side of the SiON waveguide 253 can be connected to the silicon waveguide through another spot-size converter including four subsidiary tapered waveguides, thereby achieving more efficient optical coupling and miniaturization of optical contacts. As shown in FIG. 28A, four separate signals with four wavelengths are transmitted through four silicon waveguides. Alternatively, as shown in FIG. 28B, the four separate signals having four wavelengths can be transmitted through a single silicon waveguide. In the case of the single silicon waveguide, the input side and output side of the SiON waveguide may be configured as shown in FIG. 27C or 27D. As described above, the example enables it to transmit a modulated 4-wavelength optical signal through a distance of several tens of cm at a data transmission rate of 5 to 10 Gbps per wavelength with a guide loss of several dB or less, thereby achieving a transmitting and receiving unit with a power consumption of several mW/Gbps or less.

Eighth Example

An optical waveguide in accordance with an eighth example will be described with reference to drawings.

Figure 32C:
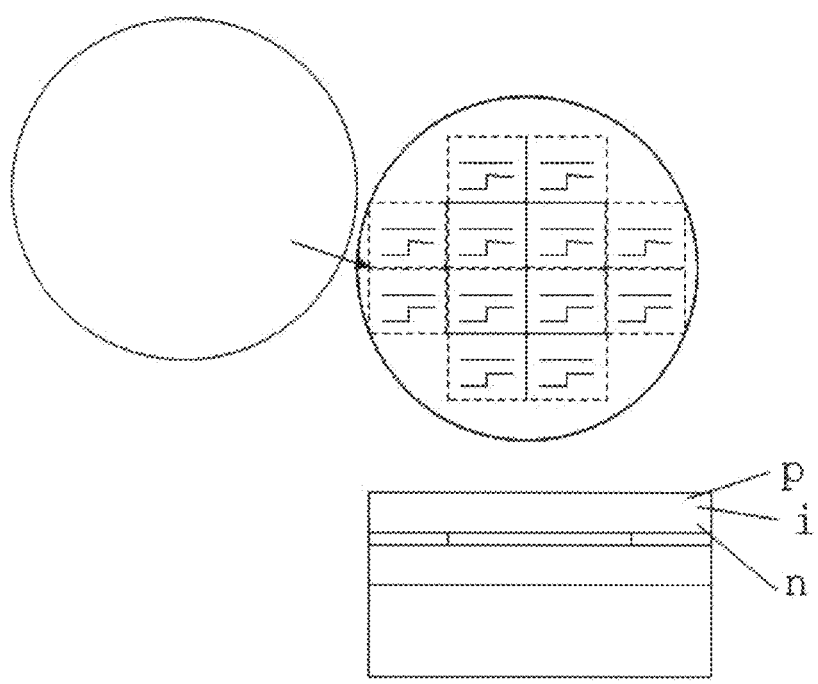
Figure 32D:
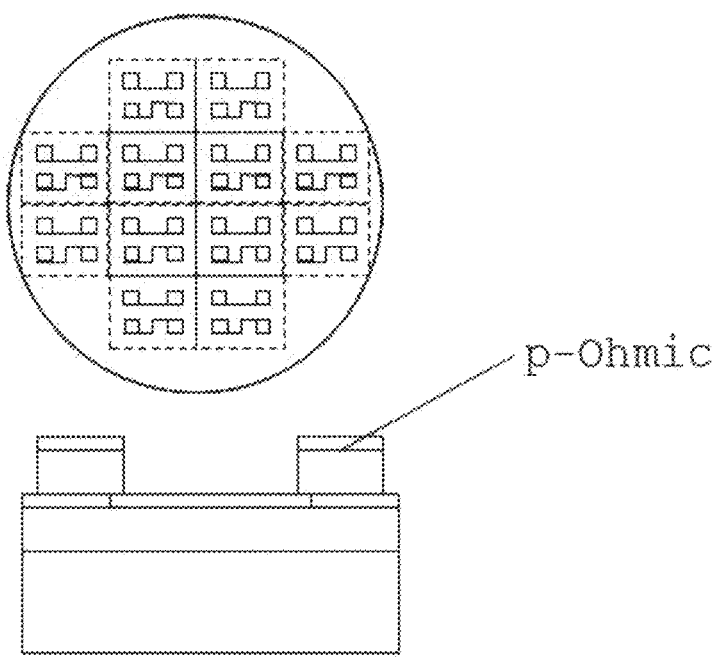

The eighth example is described with reference to manufacture of an optical interconnection unit on a silicon substrate. The optical interconnection unit includes a light-emitting element, a light-receiving element, and an optical waveguide. FIGS. 33A to 33F and FIGS. 34A to 34F are cross-sectional views showing a process flow in accordance with the eighth example. FIGS. 32A to 32D are top views and corresponding sectional views showing process-flow steps. FIGS. 33A to 33F are sectional views showing process-flow steps. As shown in FIG. 32, the manufacture of the optical interconnection unit specifically includes four manufacturing steps.

Figure 33A:
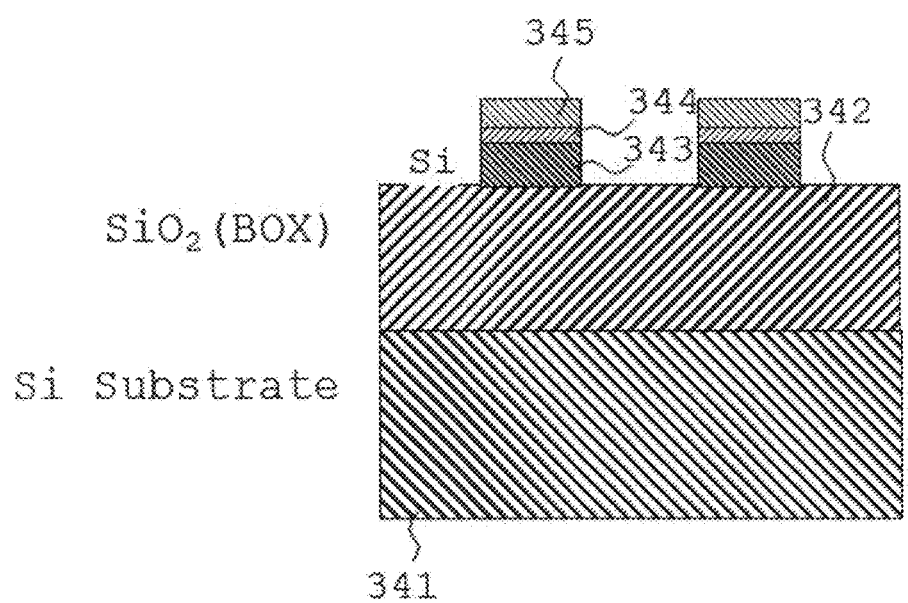
FIGS. 33A to 33F are cross-sectional views showing a process flow based on LOCOS in accordance with the eighth example.
Figure 33B:
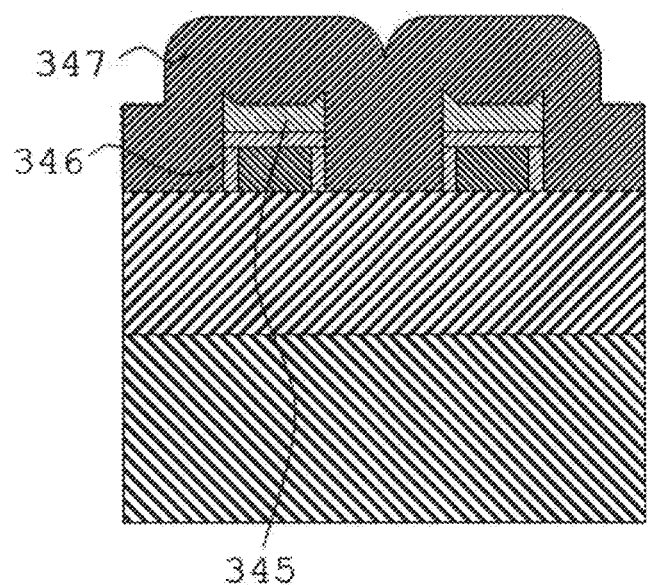

(1) Process of Manufacturing Waveguide
(2) Process of Embedding and Planarizing
(3) Process of Wafer Bonding and Substrate Removal
(4) Process of Manufacturing Elements The process (1) is to form a silicon waveguide with an SOI substrate by the method shown in FIGS. 33A to 33F. An embedded oxide layer 342 having a thickness of 2 μm is formed as a clad layer by using a 4-inch SOI wafer. A single crystalline silicon layer 343 having a thickness of 0.2 μm is formed on the embedded oxide layer 342. A $SiO_2$ pad layer 344 (10 nm in thickness), a SiN ($Si_3N_4$) layer 345 (40 nm in thickness), a photoresist layer (not shown) are in sequence formed on the single-crystalline silicon layer 343. A silicon waveguide 343 is formed using the single crystalline silicon layer by lithographic exposure and dry etching (FIG. 33A). The silicon waveguide 343 measures 0.45 μm wide by 1 to 5 mm long. An oxide layer 346 is formed by heating the wafer for one minute at temperatures of 800° C. to 1100° C. in an oxygen atmosphere using a lamp heating furnace (RTA) to oxidize sidewalls of the single-crystalline silicon layer 343. The rate of temperature increase from room temperature to the set temperature in the furnace is 50° C./sec, and the rate of temperature decrease is 33° C./sec. During the heating, the SiN layer is not oxidized, but just the sidewalls are oxidized. The oxidized sidewalls swell in volume to form a convex portion on the SiN layer 345, which is easy to planarize by polishing. Before the above-mentioned heating, the silicon wafer is subjected to pretreatment in order to remove a natural oxide film from the surface of the silicon layer, i.e., the wafer is immersed into a 2%-hydrogen fluoride solution for 30 sec, subsequently washed in pure water, and finally dried. After the heating, a 1-m-thick embedded layer 347 is deposited by plasma CVD (Plasma Enhanced Chemical Vapor Deposition) (FIG. 33B).

Figure 33C:
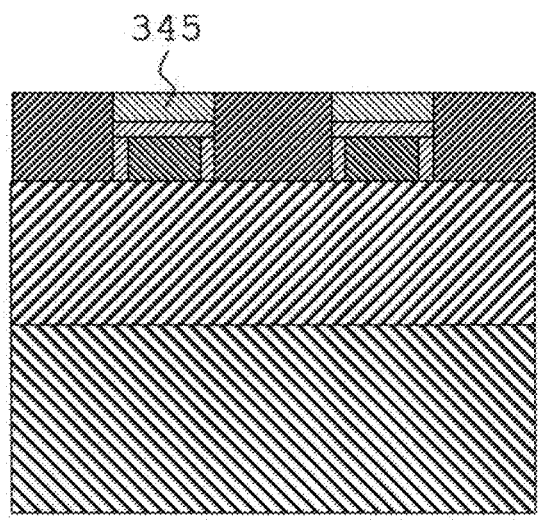

The embedded $SiO_2$ layer 347 is planarized by CMP until the SiN layer 345 is exposed (FIG. 33C). Forming the SiN layer on the silicon layer is less likely to cause convexes, called dishing, during CMP than oxidizing a silicon pattern directly without forming a SiN layer or a $SiN/SiO_2$ layer on the silicon layer.

Figure 33D:
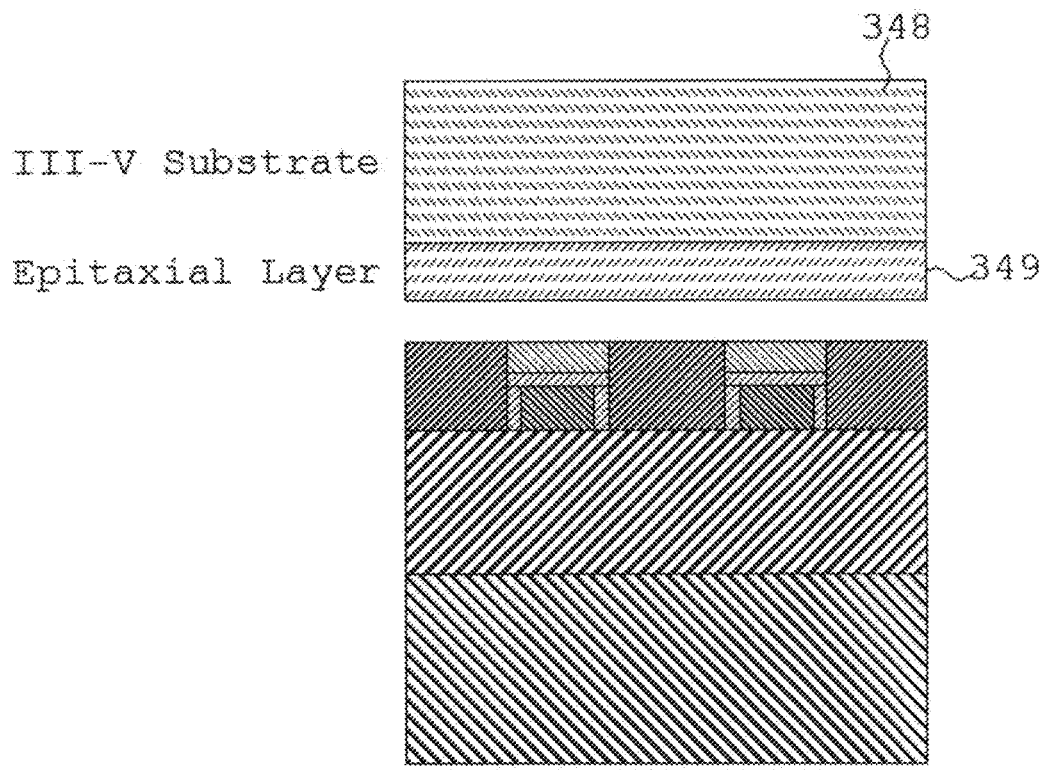
Figure 33E:
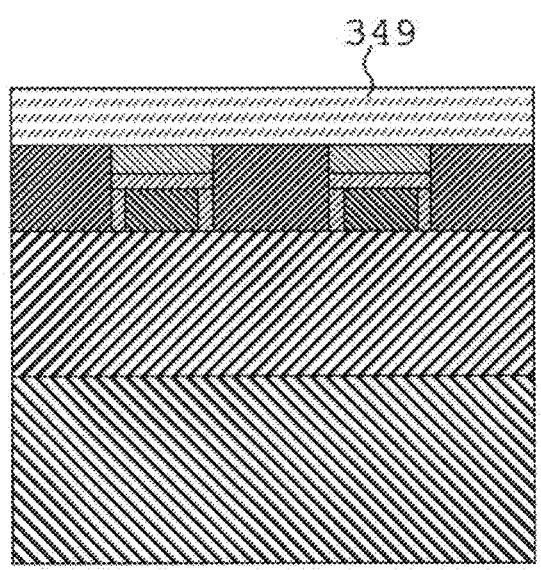
Figure 33F:
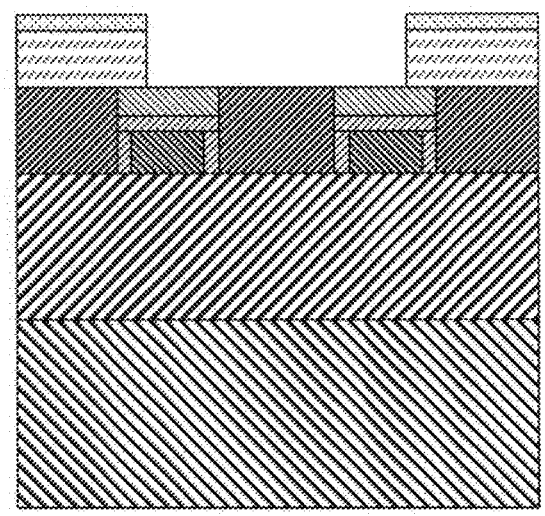

After that, wafer bonding is performed between the resultant wafer and a III-V compound semiconductor (GaAs or InP) wafer to form a light-emitting element and a light-receiving element (FIG. 33D). The III-V compound semiconductor wafer exemplifies a wafer including a AlGaAs etch stop layer, an n-type GaAs contact layer, an n-type $Al_yGa_{1-y}As$ clad layer, a AlGaAs/GaAs multiple quantum well layer, a p-type $Al_xGa_{1-x}As$ clad layer, and a p-type GaAs contact layer, which are in sequence epitaxially grown on a GaAs substrate 348 by MOCVD or MBE. In the wafer bonding, flatness of the both wafers is essential to enhance the bonding strength. Preferably, the wafers are subjected to CMP to improve the flatness. Surface protrusions are often formed on a surface of an epitaxially grown layer on a III-V compound semiconductor as a result of anomalous growth. When hardness of the surface protrusions differs from the hardness of the matrix area of the epitaxially grown layer, the surface protrusions make it difficult to obtain a flat surface by CMP. In such a case, the whole surface of the epitaxially grown layer may be covered with a polycrystalline silicon or an amorphous silicon, and the polycrystalline Si or the amorphous silicon may be subsequently polished by CMP, thereby allowing it to remove the surface protrusions. Before the wafer bonding, a $SiO_2$ film is deposited on the GaAs wafer (the p-type GaAs contact layer) by CVD to be planarized by CMP until the remained thickness of the $SiO_2$ film reaches 20 nm.

After the surfaces of the wafers are exposed to oxygen plasma or argon plasma, the two wafers are made in contact with each other in a vacuum for the wafer bonding (FIG. 33D). Such wafer bonding provides sufficient bonding strength. In order to further enhance the bonding strength, the two wafers in contact with each other may be heat-treated under pressure. For example, the heat treatment for the wafer bonding may be performed for 2 h at 150° C. under a pressure of 5 MPa.

The GaAs substrate is selectively removed from the bonded wafer until the AlGaAs etch stop layer is exposed. Before the selective removal of the GaAs substrate, the bonded wafer may be subjected to CMP such that the thickness removed by the CMP reaches several tens of μm. A mixed solution of 28%-ammonia water and 35%-oxygenated water both being mixed at a volume ratio of 1:30 is used for the selective removal. After the AlGaAs etch stop layer is exposed, the resultant wafer is immersed in 75° C.-hydrochloric acid to remove the GaAs etch stop layer. In this way, the compound semiconductors layer for making the light-emitting and light-receiving elements can be formed on the silicon substrate.

The specific light-emitting element (ring laser) and light-receiving element (optical detector) of this example are formed as well as in the examples described above. Manufacturing process will not be repeatedly described in this example. Optical waveguides are each provided in the vicinity of the ring laser and the light-receiving element. A laser beam emitted from the laser is transmitted to an optical waveguide by distributed coupling. The laser beam, which has transmitted through the optical waveguide, leaks to a light-absorbing layer of the light-receiving element to be absorbed by the light-absorbing layer and to be subsequently converted into electric signals.

Figure 36:
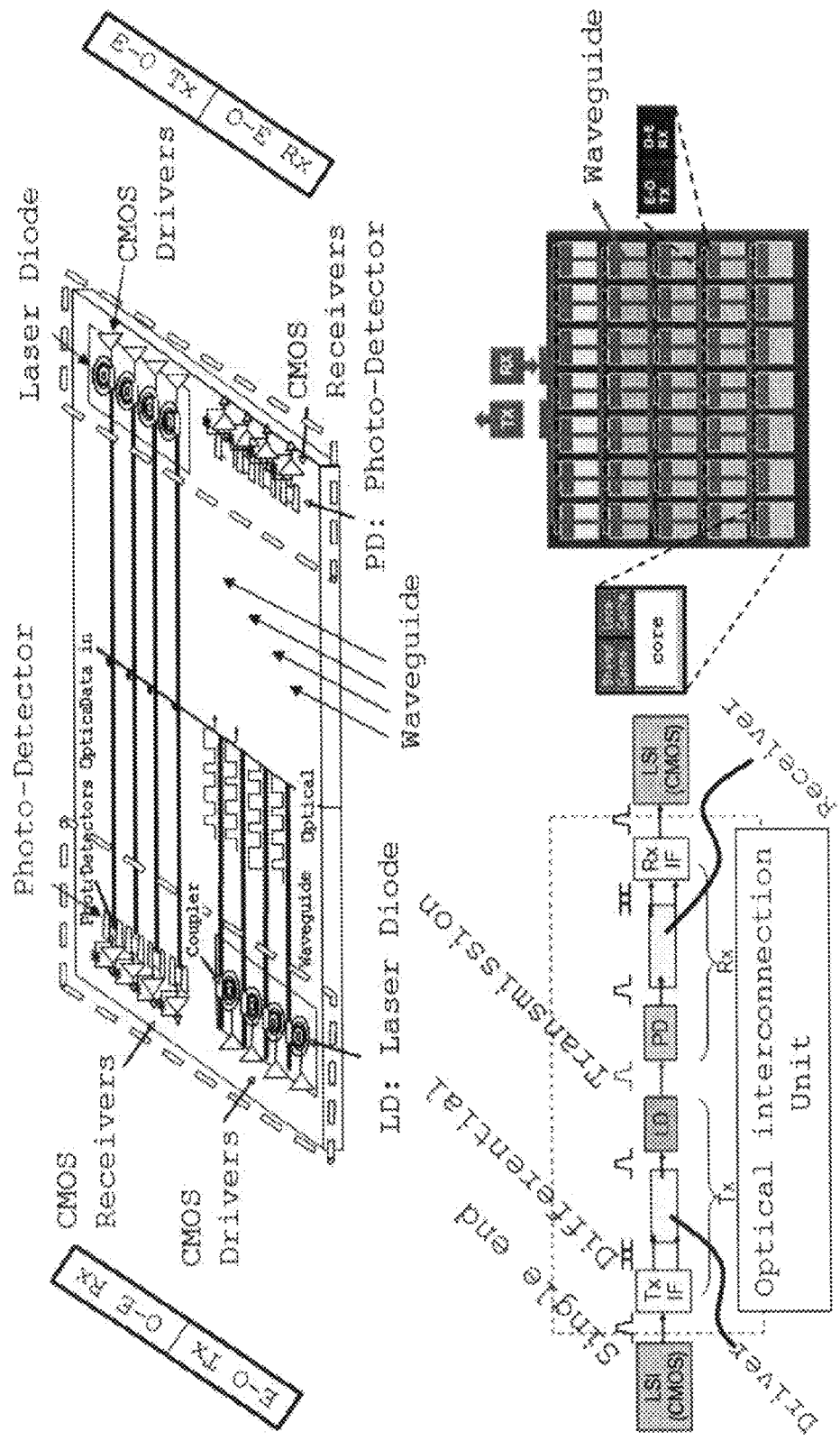
FIG. 36 exemplifies the optical interconnection unit used for an optical transmission system including waveguides provided between cores or chips in accordance with the eighth example.

FIG. 36 exemplifies the optical interconnection unit used for an optical transmission system including waveguides provided between cores or chips. A data transfer efficiency that is 5 times higher than that of the related art is yielded in the system including many cores. The system uses low latency characteristic of optical transmission, which is used for memory access among the cores and the chips. Every core inside the chip includes a local cache memory and a shared cache memory. A transmitting circuit (CMOS driver) in a core directly modulates a light-emitting element, from which optical signals are emitted. The emitted signals are coupled to an optical waveguide to be transmitted to a photo diode of another core (on the same chip or on a different chip) by distributed coupling. The optical signal received by the photo diode is converted into electric signals by a CMOS receiver, i.e., a transimpedance amplifier (TIA), thereby implementing signal transmission among cores and memory access. The oxide film formed on the silicon waveguide and the planarization treatment enable it to obtain a guide loss of 1.0 dB/cm and an optical coupling efficiency that is 90% or higher of a theoretical efficiency. The guide loss and the high coupling efficiency lead to a 30% reduction in power consumption. The guide loss and the optical coupling efficiency of the related art are typically 2.0 dB/cm and 70% of the theoretical efficiency, respectively. The eighth example achieves a large-capacity memory access and low latency, and quintuples data transmission efficiency by using optical transmission.

In this example, the silicon waveguide is formed with an SOI substrate. Alternatively, the silicon waveguide may be formed with a $SiO_2$ film as a clad layer, which is followed by depositing an amorphous silicon or a polycrystalline silicon as a core layer on the $SiO_2$ film. The amorphous silicon processed at temperatures higher than 400° C. increases the guide loss, and grain boundaries of the polycrystalline silicon causes a higher guide loss than single crystalline silicon. Preferably, the single crystalline silicon is used to achieve an optical waveguide with a low guide loss. The $SiO_2$ pad layer (10 nm in thickness) and the SiN ($Si_3N_4$) layer (40 nm in thickness) are formed for the patterning. Alternatively, a single $SiO_2$ pad layer may be formed for the patterning.

Ninth Example

Figure 34A:
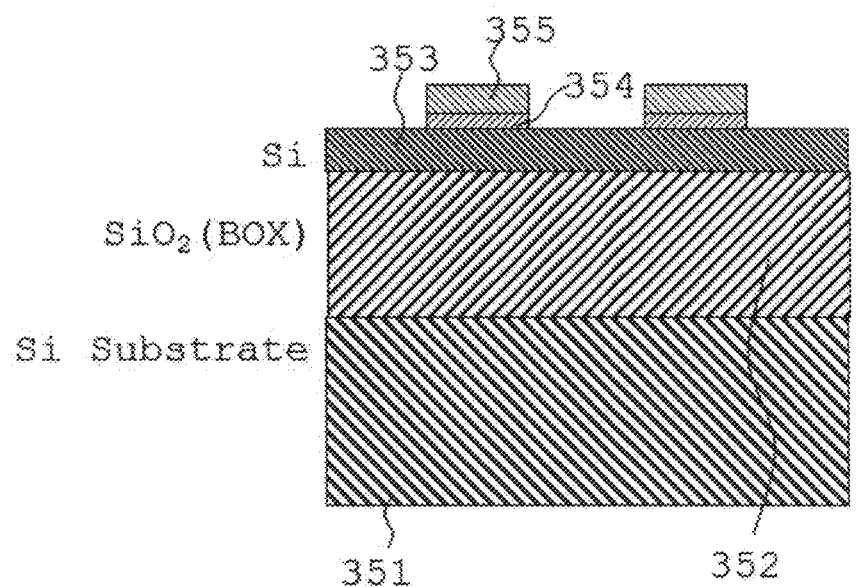
FIGS. 34A to 34F are cross-sectional views showing a process flow based on LOCOS in accordance with the eighth example.

A ninth example will be described with reference to manufacture of an optical interconnection unit on a silicon substrate as well as the eighth example. The optical interconnection unit includes a light-emitting element, a light-receiving element, and an optical waveguide. The manufacture of the optical interconnection unit specifically includes four manufacturing processes as well as in the eighth example shown in FIG. 32.
(1) Process of Manufacturing Waveguide
(2) Process of Embedding and Planarizing
(3) Process of Wafer Bonding and Substrate Removal
(4) Process of Manufacturing Elements The process (1) of the ninth example is to form a silicon waveguide with an SOI substrate by the method shown in FIGS. 34A to 34F. An embedded oxide layer 352 having a thickness of 2 μm is formed as a clad layer by using a 4-inch SOI wafer. A single-crystalline silicon layer 353 having a thickness of 0.2 μm is formed over the embedded oxide layer 352. A $SiO_2$ pad layer 354 (10 nm in thickness), a SiN ($Si_3N_4$) layer 355 (40 nm in thickness), a photoresist layer (not shown) are in sequence formed over the single-crystalline silicon layer 353. A pattern is formed on the $SiO_2$ layer and the SiN layer by lithographic exposure and dry etching (FIG. 34A). The pattern measures 0.4 μm wide by 1 to 5 mm long.

Figure 34B:
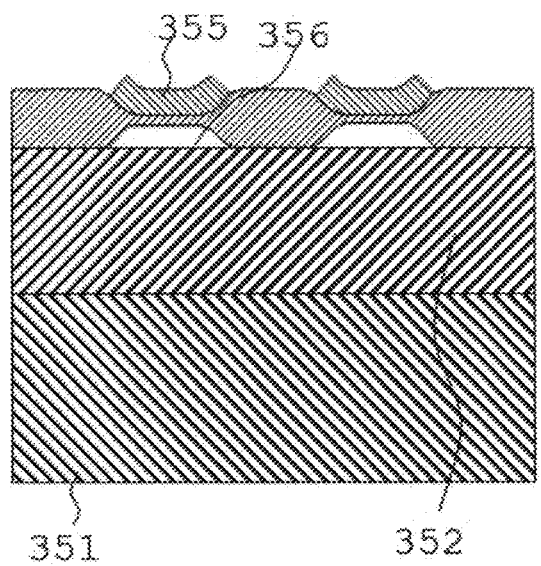
Figure 34C:
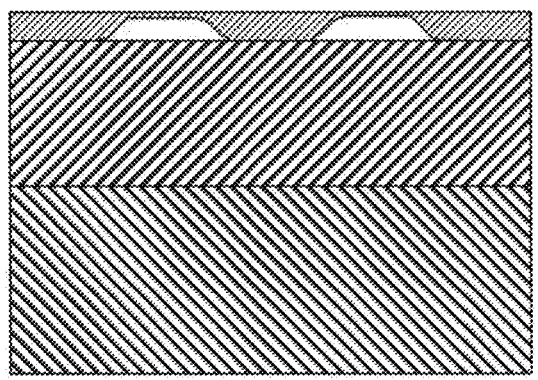
Figure 34D:
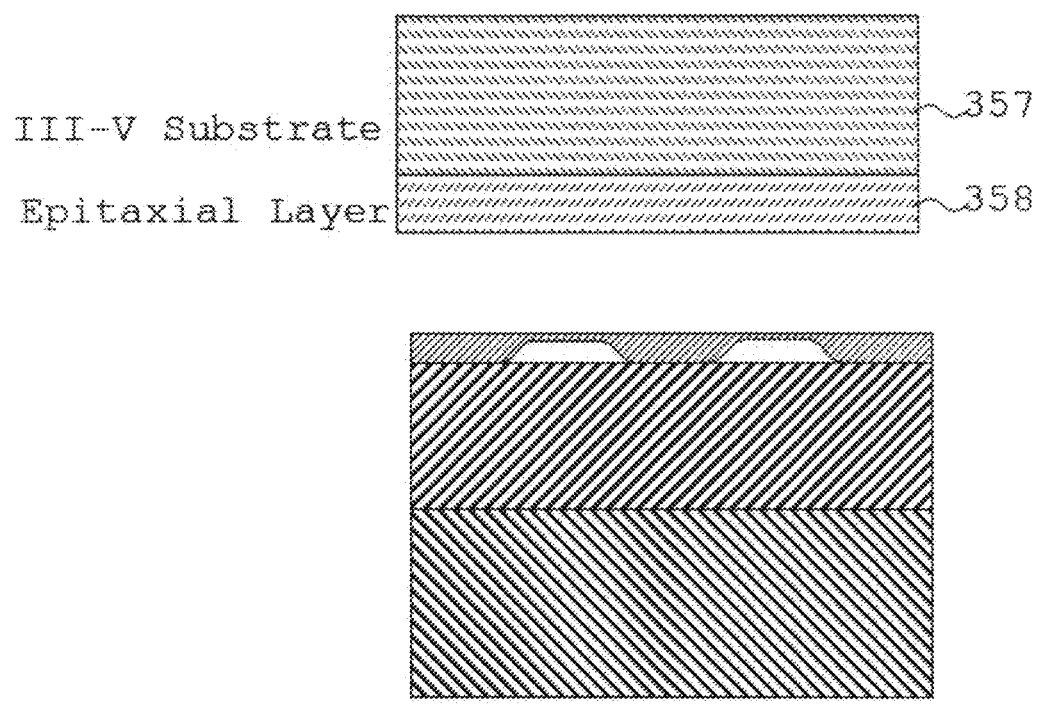
Figure 34E:
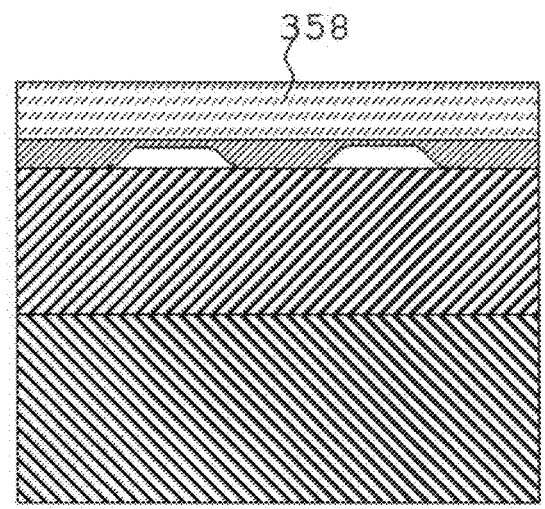
Figure 34F:
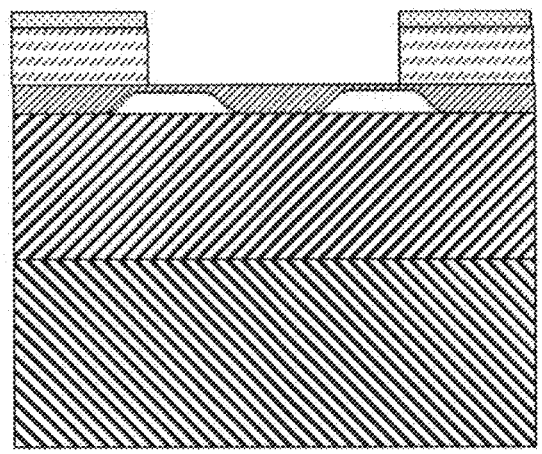

A top Si layer 355 is subjected to selective thermal oxidation, i.e., local oxidation of silicon (LOCOS), to form a silicon waveguide 356 using a mask of a silicon nitride ($Si_3N_4$) film 355 that oxygen or water hardly permeates (FIG. 34B). The method of forming the silicon waveguide 356 has advantages as follows:
(1) the method has comparatively simple steps;
(2) about half of the oxide film thickness is formed within the silicon substrate, thereby providing a less uneven surface and a smoother sidewall; and
(3) the $Si_3N_4$ mask that is not oxidized allows only the sidewall of the silicon layer immediately under the mask to be oxidized, thereby causing the SiN mask to swell on the sidewall, i.e., to form convexes thereon. The convexes are easily planarized without dishing by CMP to provide a very flat Si waveguide. The oxide layer is uniformly removed by CMP to expose the SiN layer. Subsequently, wafer bonding to a III-V compound semiconductor wafer (GaAs or InP) is performed. The compound semiconductor wafer has an AlGaAs etch stop layer, an n-type GaAs contact layer, an n-type $Al_yGa_{1-y}As$ clad layer, an AlGaAs/GaAs multiquantum well layer, a p-type $Al_xGa_{1-x}As$ clad layer, and a p-type GaAs contact layer, all of which are in sequence epitaxially grown on a GaAs substrate by MOCVD or MBE. Before the wafer bonding, a $SiO_2$ film is deposited on the GaAs wafer (the p-type GaAs contact layer) by CVD to be planarized by CMP until the thickness of the $SiO_2$ film reaches 20 nm. After the surfaces of the wafers are exposed to oxygen plasma or argon plasma, the two wafers are made in contact with each other in a vacuum for the wafer bonding. Such wafer bonding provides sufficient bonding strength. In order to further enhance the bonding strength, the two wafers in contact with each other may be heat-treated under pressure. For example, the heat treatment for the wafer bonding may be performed for 2 h at 150° C. under a pressure of 5 MPa.

The GaAs substrate is selectively etched from the bonded wafer until the AlGaAs etch stop layer is exposed. Before the selective etching of the GaAs substrate, the bonded wafer may be subjected to CMP such that the thickness removed by the CMP reaches several tens of μm. A mixed solution of 28%-ammonia water and 35%-oxygenated water both being mixed at a volume ratio of 1:30 is used for the selective etching. After the AlGaAs etch stop layer is exposed, the resultant wafer is immersed in 75° C.-hydrochloric acid to remove the GaAs etch stop layer. In this way, the compound semiconductors layer including the light emitting and receiving elements is formed on the silicon substrate.

The specific light-emitting element (ring laser) and light-receiving element (optical detector) of this example are formed as well as in the examples described above. Manufacturing process will not be repeatedly described in this example. Optical waveguides are each provided in the vicinity of the ring laser and the light-receiving element. A laser beam emitted from the laser is transmitted to an optical waveguide by distributed coupling. The laser beam, which has transmitted through the optical waveguide, leaks to a light-absorbing layer of the light-receiving element to be absorbed by the light-absorbing layer and to be subsequently converted to electric signals. The optical interconnection unit is used for an optical transmission system including waveguides provided between cores or chips as shown in FIG. 36. A data transfer efficiency that is 5 times higher than that of the related art is yielded in the system including many cores. The system uses low latency characteristic of optical transmission, which is used for memory access among the cores and the chips. Every core inside the chip includes a local cache memory and a shared cache memory. A transmitting circuit (CMOS driver) in a core directly modulates a light-emitting element, from which optical signals are emitted. The emitted signals are coupled to an optical waveguide to be transmitted to a light-receiving element (photo diode) of another core (on the same chip or on a different chip) by distributed coupling. The optical signal received by the photo diode is converted to electric signals by a receiving circuit (CMOS receiver) including a transimpedance amplifier (TIA), thereby implementing signal transmission among cores and memory access. The oxide film formed on the silicon waveguide and the planarization treatment enable it to obtain a guide loss of 0.8 dB/cm and an optical coupling efficiency that is 90% or higher of a theoretical efficiency. The guide loss and the high coupling efficiency lead to a 35%-reduction in power consumption. The guide loss and the optical coupling efficiency of the related art are typically 2.0 dB/cm and 70% or higher of the theoretical efficiency, respectively. The ninth example achieves a large-capacity memory access and low latency, and quintuples data transmission efficiency by using optical transmission.

Tenth Example

Figure 35A:
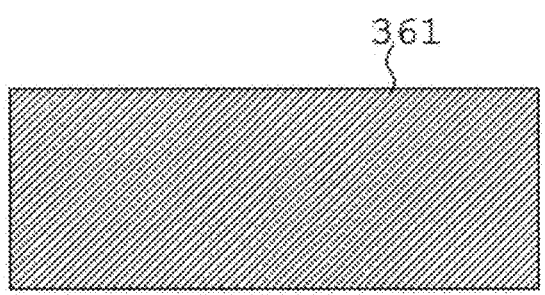
FIGS. 35A to 35I are cross-sectional views showing a process flow based on LOCOS in accordance with the eighth example.
Figure 35B:
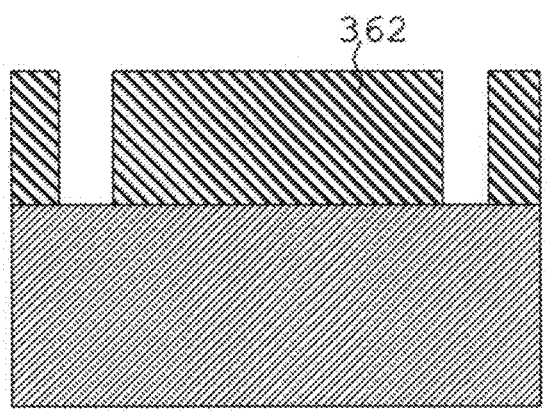
Figure 35C:
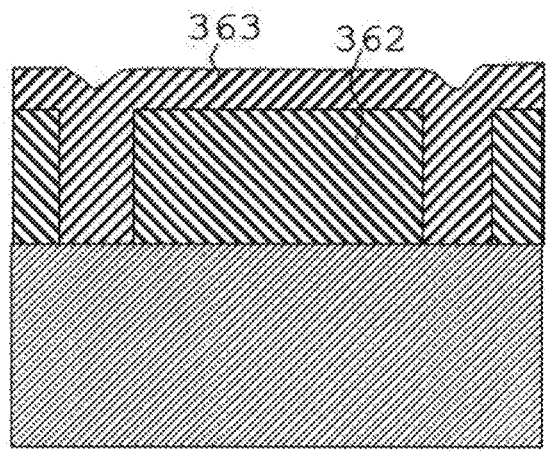
Figure 35D:
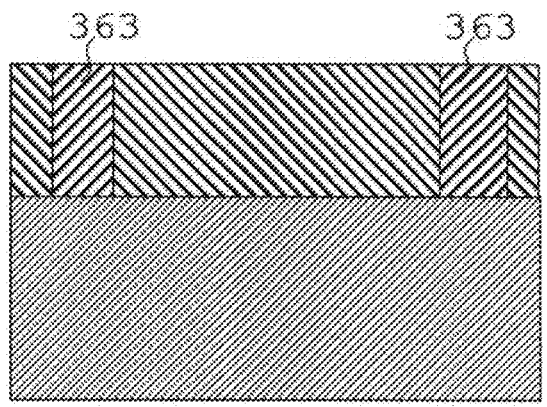
Figure 35E:
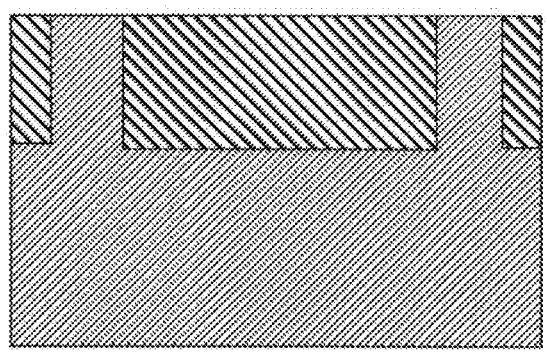
Figure 35F:
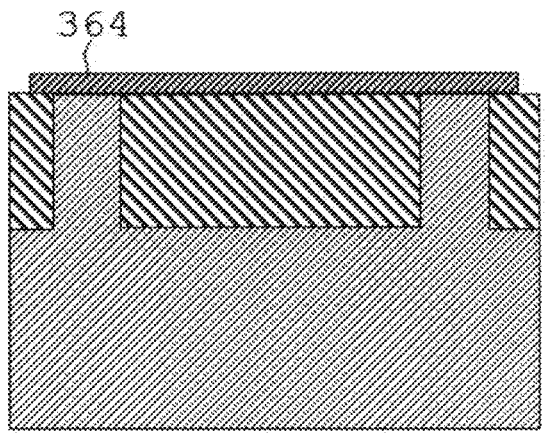
Figure 35G:
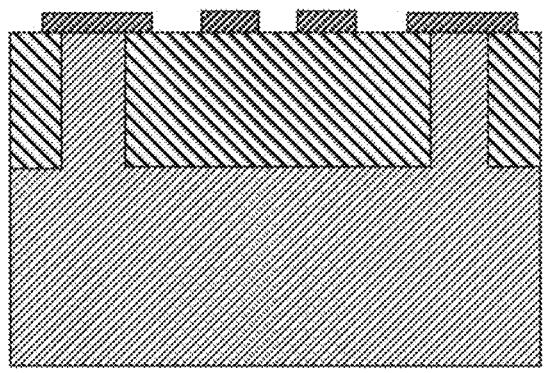
Figure 37A:
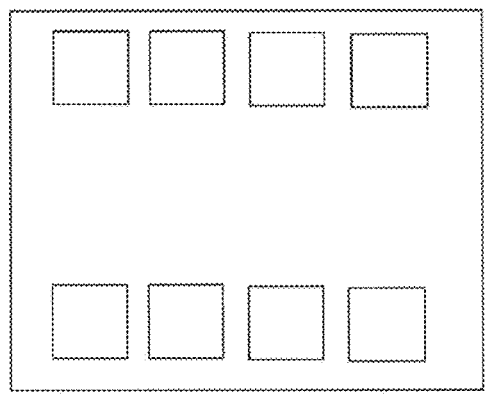
FIGS. 37A to 37E illustrate steps of silicon waveguides in accordance with a tenth example.
Figure 37B:
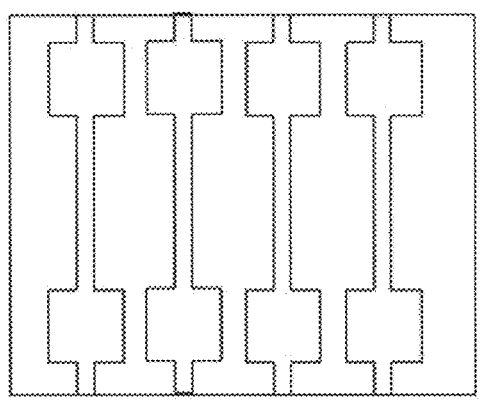
Figure 37C:
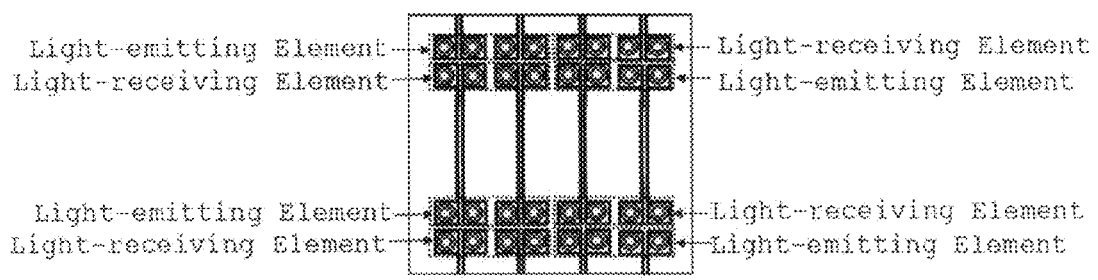
Figure 37D:
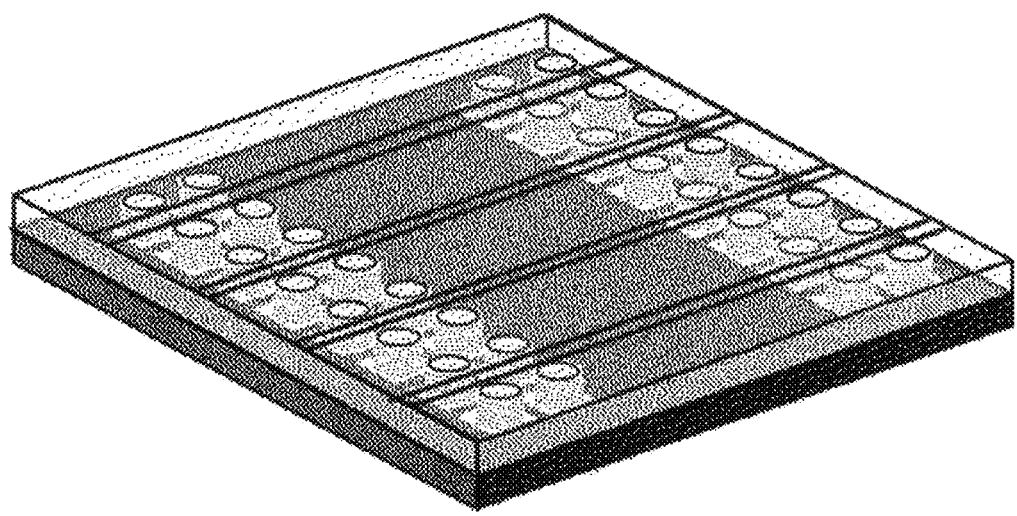
Figure 37E:
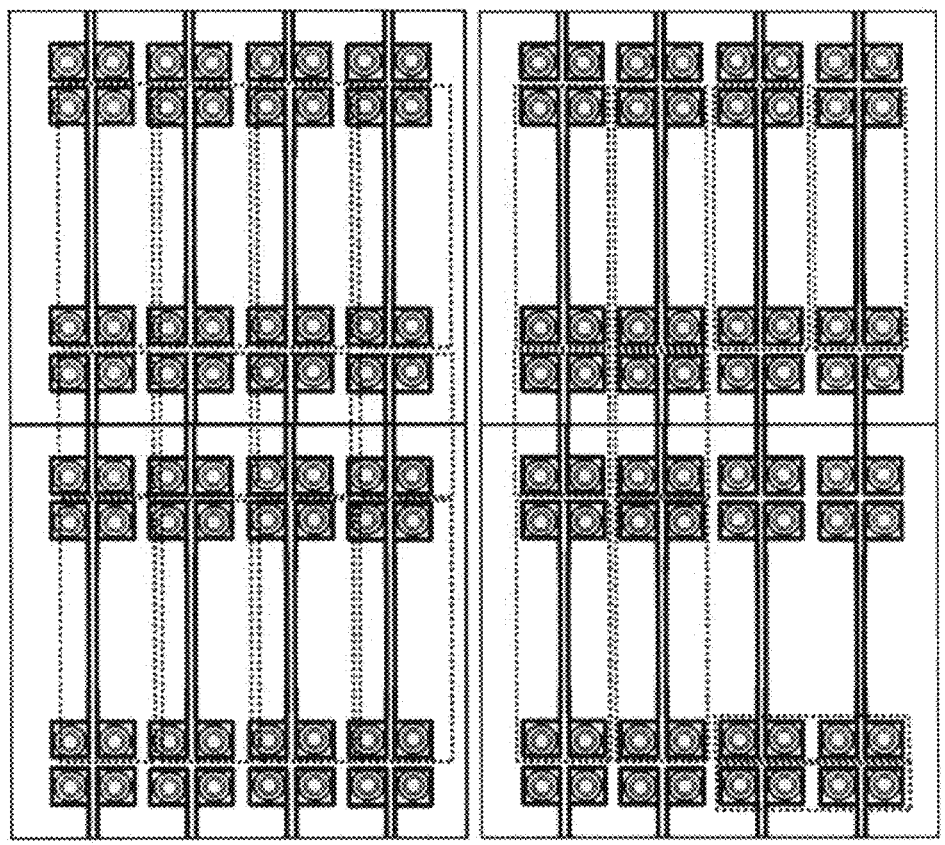
Figure 38A:
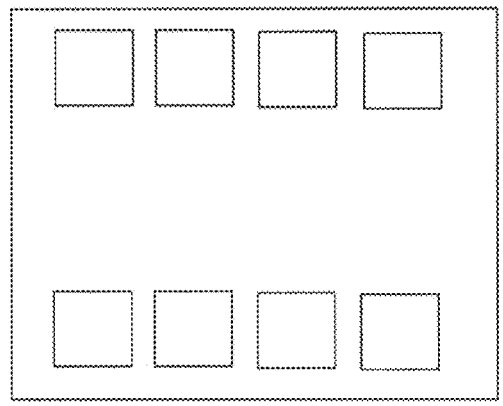
FIGS. 38A to 38E illustrate steps of silicon waveguides in accordance with the tenth example.
Figure 38B:
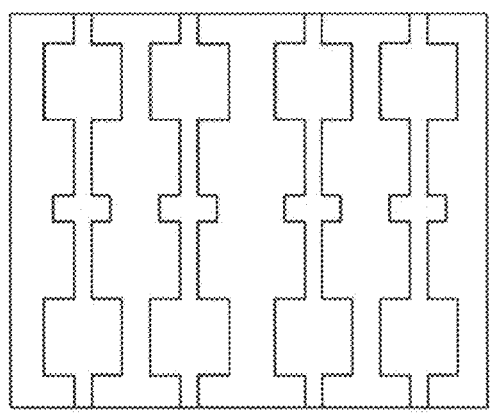
Figure 38C:
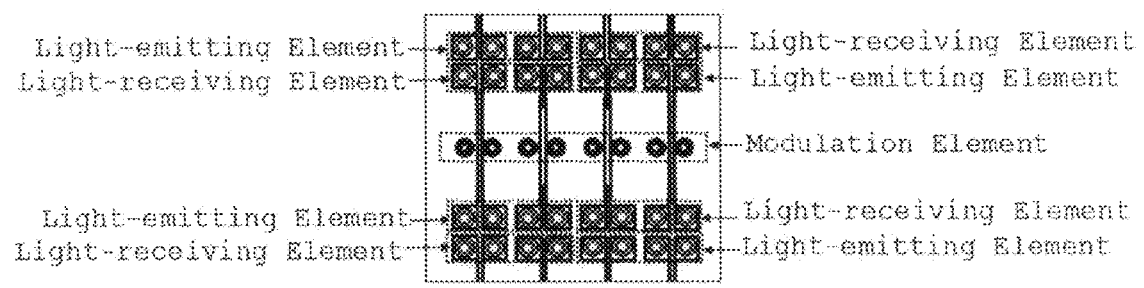
Figure 38D:
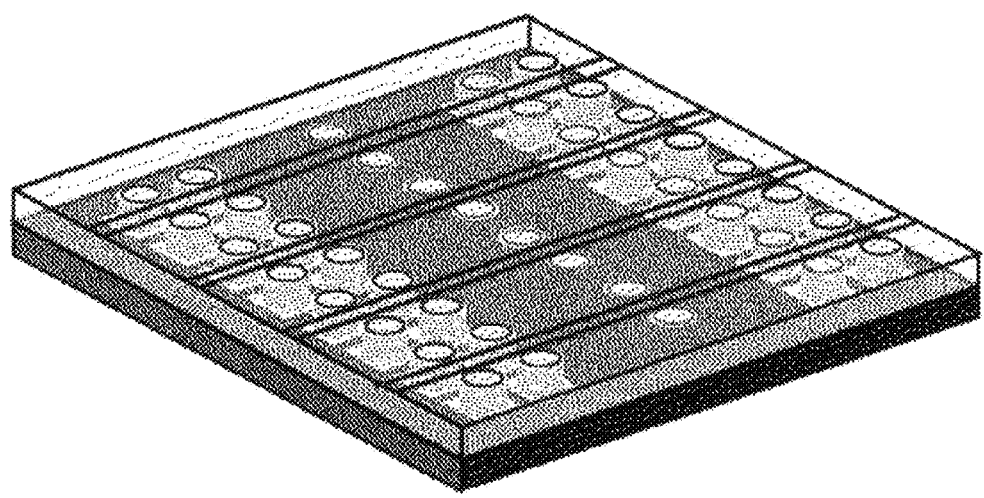
Figure 38E:
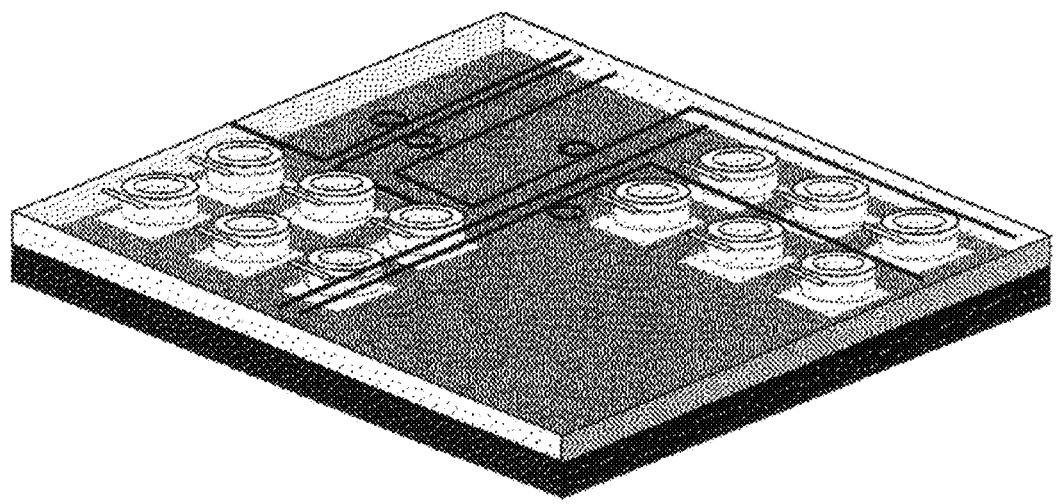
Figure 39A:
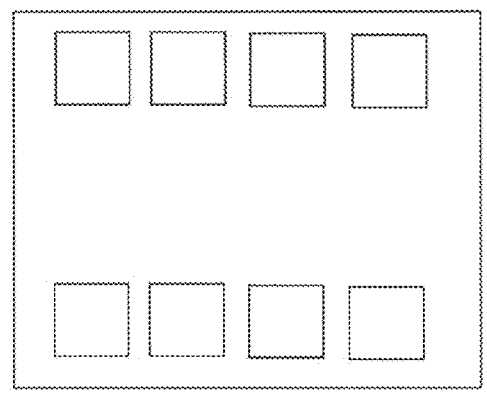
FIGS. 39A to 39E illustrate steps of silicon waveguides in accordance with the tenth example.
Figure 39B:
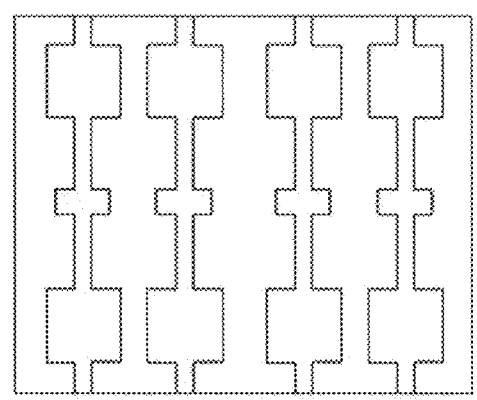
Figure 39C:
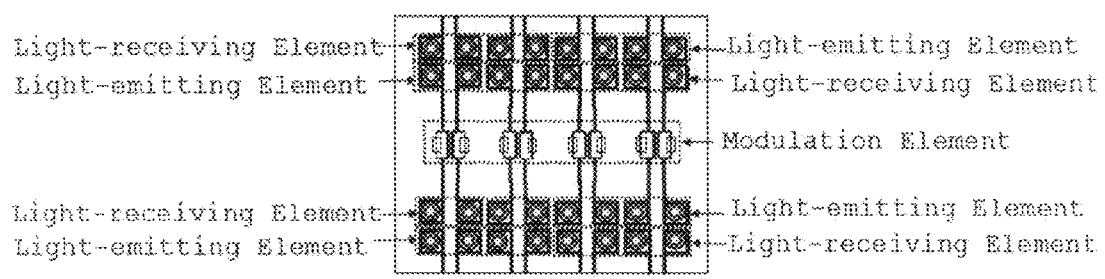
Figure 39D:
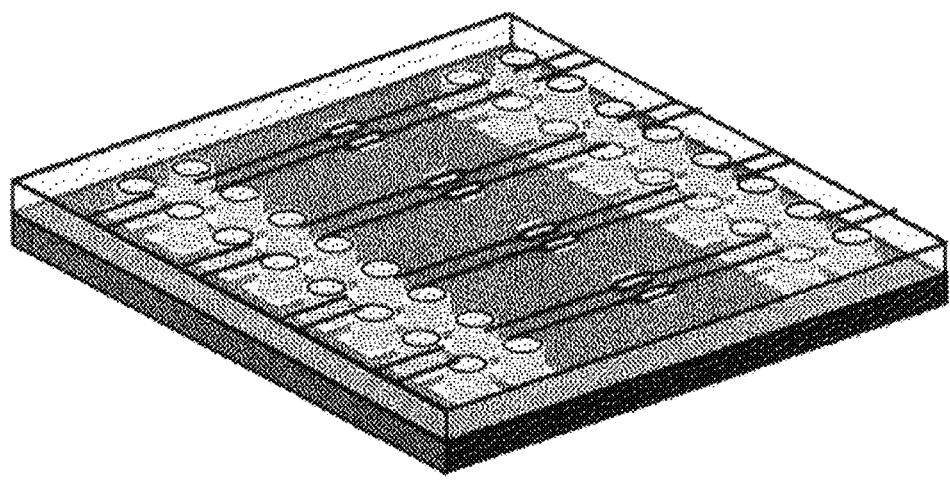
Figure 39E:
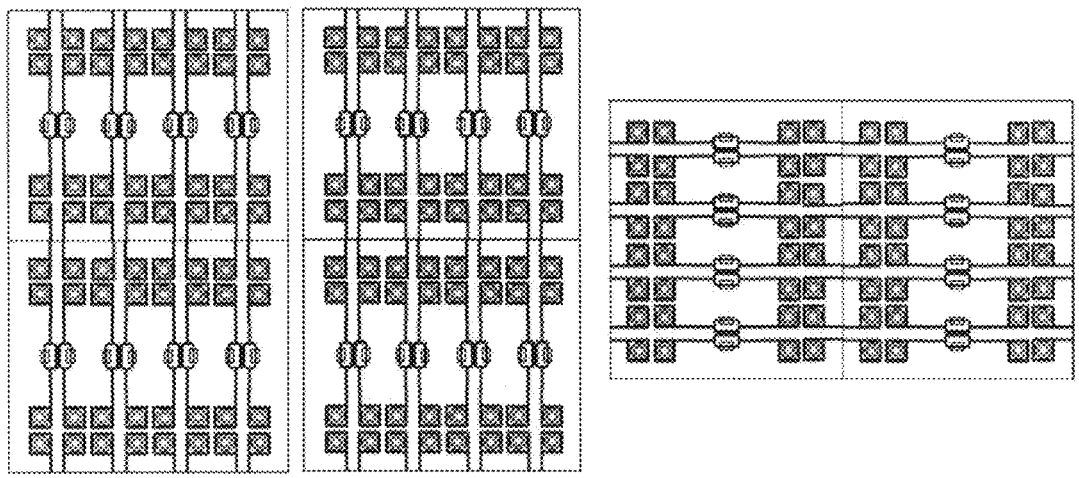

A tenth example will be described with reference to manufacture of an optical interconnection unit on a Silicon substrate as well as the eighth and ninth examples. The optical interconnection unit includes a light-emitting element, a light-receiving element, and an optical waveguide. The manufacture of the optical interconnection unit specifically includes 4 manufacturing processes as well as in the eighth example shown in FIG. 32.
(1) Process of Manufacturing Waveguide
(2) Process of Embedding and Planarizing
(3) Process of Wafer Bonding and Substrate Removal
(4) Process of Manufacturing Elements The process (1) of the tenth example is to form a silicon waveguide with a Silicon substrate by the method shown in FIGS. 35A to 35 I. An oxide film $SiO_2$ layer 362 (2 μm in thickness) is first formed on a Silicon substrate by a thermal oxidation process with a 4-inch Si wafer 361. A pattern (50-μm square, cross-sectionally shown in FIG. 35B, top view shown in FIG. 37A) is secondly formed to obtain a crystalline silicon layer by solid-phase growth. An embedded layer 363 of amorphous silicon is deposited over the crystalline silicon layer by CVD (FIG. 35C). The embedded layer is planarized by CMP such that the amorphous silicon remains just on the pattern (FIG. 35D). Subsequently, the resultant wafer is heat-treated at temperatures of 500 to 600° C., thereby causing the amorphous silicon to be a single crystal as a result of solid-phase growth from the underlayer Silicon substrate. Another amorphous silicon layer 364 is formed on the above-mentioned planarized structure to be patterned as portions of a light-emitting element, a light-receiving element, and a waveguide (FIG. 35E, FIG. 37B).

Figure 35H:
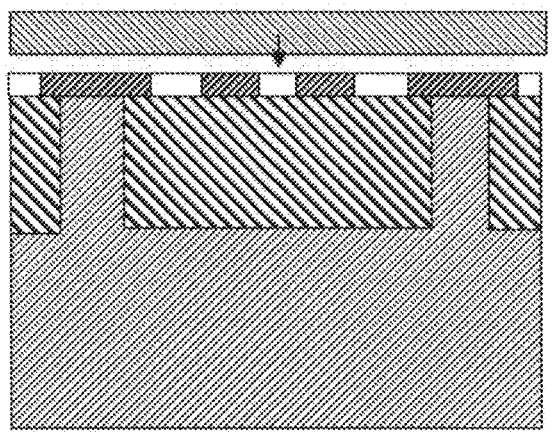
Figure 35I:
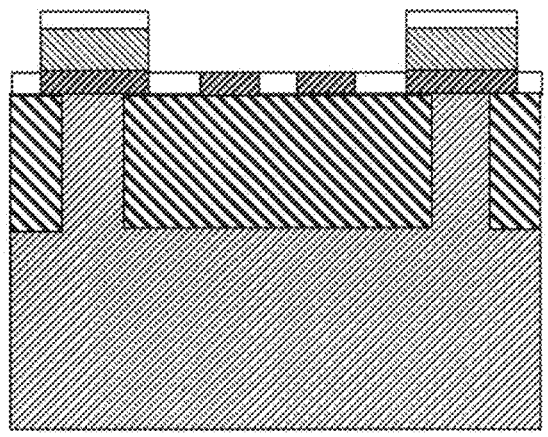

Subsequently, the resultant wafer is again heat-treated at temperatures of 500 to 600° C., thereby causing the patterned amorphous silicon to be a single crystal as a result of solid-phase growth. After that, the manufacture of the waveguide (FIG. 35F, FIG. 35G), embedding the $SiO_2$ layer, and planarization by CMP are followed by wafer bonding and manufacture of light-emitting and light-receiving elements to accomplish an optical interconnection unit (FIG. 35H, FIG. 35I). The specific light-emitting element (ring laser) and light-receiving element (optical detector) of this example are formed as well as in the examples described above. Manufacturing process will not be repeated in this example. The ring laser and the light-receiving element are formed on silicon, thereby providing an interconnection unit with excellent heat-radiation performance and heat resistance at high temperatures. Optical waveguides are each provided in the vicinity of the ring laser and the light-receiving element. A laser beam emitted from the laser is transmitted to an optical waveguide by distributed coupling. The laser beam, which has transmitted through the optical waveguide, leaks to a light-absorbing layer of the light-receiving element to be absorbed by the light-absorbing layer and to be subsequently converted into electric signals.

The optical interconnection unit of this example is used for an optical transmission system including waveguides provided between cores or chips as shown in FIG. 36. A data transfer efficiency that is 5 times higher than that of the related art is yielded in the system including many cores. The system uses low latency characteristic of optical transmission, which is used for memory access among the cores and the chips. Every core inside the chip includes a local cache memory and a shared cache memory. A transmitting circuit (CMOS driver) in a core directly modulates a light-emitting element, from which optical signals are emitted. The emitted signals are coupled to an optical waveguide to be transmitted to a photo diode of another core (on the same chip or on a different chip) by distributed coupling. The optical signal received by the photo diode is converted to electric signals by a light-receiving element (CMOS receiver) including a transimpedance amplifier (TIA), thereby implementing signal transmission among cores and memory access. The oxide film formed on the silicon waveguide and the planarization treatment enable it to obtain a guide loss of 0.8 dB/cm and an optical coupling efficiency that is 90% or higher of a theoretical efficiency. The guide loss and the high coupling efficiency lead to a 35%-reduction in power consumption. The guide loss and the optical coupling efficiency of the related art are typically 2.0 dB/cm and 70% or higher of the theoretical efficiency, respectively. The tenth example achieves a large-capacity memory access and low latency, and quintuples data transmission efficiency by using optical transmission.

As shown in FIGS. 38A to 38E, optical transmission is implemented by providing a modulator in addition to the light-emitting and light-receiving elements. In FIGS. 38A to 38E, ring modulators are formed by using crystallized silicon in the same way as the waveguides. The modulators modulate a continuous light beam by driving a CMOS drive circuit near the modulators to enable optical transmission. As shown in FIGS. 39A to 39E, optical transmission is implemented by providing a modulator in addition to light-receiving elements. Modulators of Mach-Zehnder interferometer type are formed by using crystallized silicon in the same way as the waveguides. The modulators modulate a continuous light beam by driving a CMOS drive circuit to enable optical transmission. A data transfer efficiency that is 5 times higher than that of the related art is yielded when the optical interconnection unit is used for the system including many cores shown in FIG. 36. The unit achieves low latency and large-capacity memory access, thereby leading to a 20%-reduction in power consumption in comparison with the related art. The tenth example achieves a large-capacity memory access and low latency, and quintuples data transmission efficiency by using optical transmission.

In the examples, very fast data transmission is enabled by using optical signals transmitting through the optical waveguides among circuits provided on the integrated-circuit chip. In the examples, CPU and memory devices are included in the circuit block to tremendously improve a signal transmission speed between the CPU and the memory devices. The speed is a bottle neck of computers in the related art. Preferably, the circuits are also electrically connected to each other in the in-chip or inter-chip optical interconnection system of the examples. In the examples, signals that do not need fast transmission or fast power supply may be transmitted through metal interconnections, and signals that need fast transmission may be transmitted through the optical interconnections.

In the examples, the optical interconnection system with a simple configuration is provided to achieve fast signal processing as a whole. Preferably, the in-chip or inter-chip optical interconnection unit and circuitry include the optical interconnection unit having the light-emitting function or the light-receiving function which is optically connected to the optical interconnections, and the integrated circuit chip is electrically connected to the circuit blocks.

In the examples, the optical interconnection unit, which is three-dimensionally integrated and is arranged near the circuit block by wafer bonding or adhesion, enables it to convert electric signals into optical signals, or to convert optical signals to electric signals. In the examples, using the optical interconnection unit and the optical waveguide achieves a very fast data transmission among the circuit blocks. In the examples, the optical interconnection unit is enabled to be small in shape, which has a section of several hundreds of μm square or less and a thickness of several tens of μm or less, thereby providing a compact system capable of performing faster signal processing than a system in the related art.

Preferably, the optical interconnection unit is electrically connected to the circuit block in the optical interconnection system of the examples. In the examples, the optical interconnection unit converts electrical signals from circuit blocks to optical signal, thereby enabling data to be fast transmitted between the circuit blocks through the optical interconnection unit and the waveguides. In the examples, the optical interconnection unit having the light-emitting function or the light-receiving function is three-dimensionally integrated to be arranged at a predetermined position on the circuit block by wafer bonding or adhesion, thereby providing a more compact configuration. In the example, the circuit block and the optical interconnection unit can be electrically connected to each other with metal interconnections and electrodes inside the circuit block, and do not need to form metal interconnections and electrodes outside the circuit block, thereby enabling it to employ the simple manufacturing process. Preferably, in the examples, the optical waveguide is partially provided as to overhang the optical interconnection unit.

In the examples, all light emitted from the optical interconnection unit with the light-emitting function can enter the optical waveguides, and the light transmitting through the optical waveguides can enter the optical interconnection unit with the light-receiving function. Thus, the examples achieve the optical interconnection system with the simple configuration that is easy to achieve. Preferably, the optical interconnection system of the examples is partially provided on an upper surface of the circuit block. In the examples, the optical interconnection units are each attached to the circuit blocks, and the optical interconnection units can be connected to one optical waveguide. Thus, the examples achieve the optical interconnection system with the simple configuration that is easy to achieve.

Preferably, at least a portion of the optical waveguide of the examples is provided on the circuit block as to pass over the circuit block in the optical interconnection system of the examples. In the examples, the optical waveguide is enabled to be provided on the integrated circuit block regardless of whether or not the optical waveguide is on the circuit blocks, thereby enabling it to shorten a path length of the optical waveguide. Preferably, at least a portion of the optical waveguide of the examples is provided on the circuit block as to bypass the circuit block in the optical interconnection system of the examples.

In the examples, providing the optical waveguides such that the optical waveguides bypass a circuit-block region enhances an optical-coupling efficiency when the integrated circuit chip has a comparatively large difference in level on a boundary between the circuit-block region and the non-circuit-block region thereon. Preferably, the circuit block includes any one of analog circuits, such as CPU (MPU), a memory circuit, DSP, an RF amplifying circuit, etc., and an image sensor in the optical interconnection system of the examples. In the examples, a signal transmission speed between CPU and memory devices is tremendously improved. The speed is a bottle neck in high-speed information processing in the computer system of the related art. The examples enable it to replace a configuration of the related art, where many metal interconnections make up a buss between CPU and memory circuits, with the optical waveguides and the optical interconnection unit. Thus, the examples provide the more compact and high-performance computer system than the one-chip computer of the related art.

Preferably, the optical waveguides make up a transmission line for data signals or clock signals in the optical interconnection system of the examples. In the examples, a high-speed transmission of data signals and clock signals is achieved using the compact configuration. Preferably, the optical interconnection units are provided to one circuit block, and the waveguides are each provided to the respective optical interconnection units in the optical interconnection system of the examples. In the examples, input-output signals are transmitted in parallel to one circuit block with a plurality of sets of the optical interconnection units and the optical waveguides. Thus, the examples enable it to further increase a transmission speed at which signals transmit between the circuit blocks. Preferably, the integrated-circuit chips are mounted on the substrate, arranged closely to each other, and optically or electrically connected to each other in the optical interconnection system of the examples.

Preferably, the integrated-circuit chips are mounted on the substrate, arranged closely to each other, and optically or electrically connected to each other in the optical interconnection system of the examples. In the examples, the integrated-circuit chips are mounted on the substrate, and are arranged such that the sides of the integrated-circuit chips are closely-attached to each other, thereby enabling it to optically or electrically connect the integrated-circuit chips to each other in a simple way. In the examples, a high-speed signal transmission not only for inter-chip signals but also for connecting integrated circuits to each other is enabled by optical signals or electrical signals, thereby achieving the more compact and large-scale computer system with high speed including the integrated-circuit chips. In the examples, the electrooptical system includes the optical interconnection system. In the examples, the electronic device includes the optical interconnection system. In the examples, the module with CPU and memory circuits connected to each other by the optical interconnection system is provided to the electronic device, thereby enabling it to provide the compact and high-performance electronic device, which is capable of performing faster signal processing than the device of the related art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical interconnection device, comprising:
   a ring-shaped light-emitting element and a disk-shaped light-receiving element, both with the ring-shaped light-emitting element and the disk-shaped light-receiving element having at least a portion with a same layered structure and being formed on a silicon substrate, at least a portion of the ring-shaped light-emitting element being embedded in an insulator, at least a portion of the disk-shaped light-receiving element being embedded in the insulator; and
   an optical waveguide being formed over the insulator, the optical waveguide being optically coupled to the ring-shaped light-emitting element and the disk-shaped light-receiving element by distributed coupling,
   wherein at least a part of the optical waveguide which is optically coupled to the disc-shaped light-receiving element consists of amorphous silicon and is in a spiral,
   the ring-shaped light-emitting element includes an active layer, the disc-shaped light-receiving element includes a light-absorbing layer, and the active layer of the ring-shaped light-emitting element and the light-absorbing layer of the disc-shaped light-receiving element are in the portion with the same layered structure and at a same height above the silicon substrate.

2. The device according to claim 1, wherein a layer is formed between the silicon substrate and both the ring-shaped light-emitting and the disk-shaped light-receiving elements, the layer including at least one selected from the group consisting of metal, amorphous silicon, and polycrystalline silicon.

3. The device according to claim 2, wherein the ring-shaped light-emitting and disk-shaped light-receiving elements include compound semiconductors.

4. The device according to claim 1, wherein an electronic circuit for driving the ring-shaped light-emitting and the disk-shaped light-receiving elements is formed in the silicon substrate.

5. The device according to claim 1, wherein at least a portion of the waveguide coupled to the ring-shaped light-emitting and the disk-shaped light-receiving elements is coupled to a waveguide including a dielectric or organic material.

6. The device according to claim 1, wherein the optical waveguide consists of amorphous silicon.

7. The device according to claim 1, wherein the optical waveguide is formed over the active layer of the ring-shaped light-emitting element and the light-absorbing layer of the disc-shaped light-receiving element.

8. An optical interconnection device, comprising:
an electric circuit and metal interconnections, both being formed in a silicon substrate, a portion of the metal interconnections being in contact with the silicon substrate without being electrically connected to the electric circuit;
a ring-shaped light-emitting element and a disk-shaped light-receiving element, both having a layered structure and being formed over the metal interconnections, at least a portion of the ring-shaped light-emitting element being embedded in an insulator, at least a portion of the disk-shaped light-receiving element being embedded in the insulator; and
an optical waveguide being formed over the insulator, the optical waveguide being optically coupled to the ring-shaped light-emitting element and the disk-shaped light-receiving element by distributed coupling,
wherein at least a part of the optical waveguide which is optically coupled to the disc-shaped light-receiving element consists of amorphous silicon and is in a spiral,
the ring-shaped light-emitting element includes an active layer,
the disc-shaped light-receiving element includes a light-absorbing layer, and
the active layer of the ring-shaped light-emitting element and the light-absorbing layer of the disc-shaped light-receiving element are at a same height above the silicon substrate.

9. The device according to claim 8, wherein the optical waveguide consists of amorphous silicon.

10. The device according to claim 8, wherein the optical waveguide is formed over the active layer of the ring-shaped light-emitting element and the light-absorbing layer of the disc-shaped light-receiving element.

11. A method of manufacturing an optical interconnection device, the method comprising:
bonding an epitaxially grown layer formed on a semiconductor substrate to a silicon substrate, the epitaxially grown layer being included in a ring-shaped light-emitting element and a disk-shaped light-receiving element;
removing the semiconductor substrate;
forming the ring-shaped light-emitting element and the disk-shaped light-receiving element;
forming a first insulator layer over both the ring-shaped light-emitting element and the disk-shaped light-receiving element;
planarizing the first insulator layer by polishing;
forming an optical waveguide on the polished first insulator;
covering the optical waveguide with a second insulator layer; and
providing electrical interconnections to the ring-shaped light-emitting element and the disk-shaped light-receiving element,
wherein at least a part of the optical waveguide which is optically coupled to the disc-shaped light-receiving element consists of amorphous silicon and is in a spiral,
the ring-shaped light-emitting element includes an active layer,
the disc-shaped light-receiving element includes a light-absorbing layer, and
the active layer of the ring-shaped light-emitting element and the light-absorbing layer of the disc-shaped light-receiving element are at a same height above the silicon substrate.

12. The method according to claim 11, further comprising:
depositing amorphous silicon or polycrystalline silicon over the epitaxially grown layer;
planarizing the amorphous silicon or the polycrystalline silicon by polishing; and
bonding a planarized surface of the amorphous silicon or the polycrystalline silicon to the silicon substrate.

13. The method according to claim 11, further comprising:
forming an epitaxially grown layer;
forming a metal layer over the silicon substrate; and
bonding the epitaxially grown layer to the metal layer.

14. The method according to claim 11, further comprising:
forming amorphous silicon or polycrystalline silicon over the epitaxially grown layer;
planarizing the amorphous silicon or the polycrystalline silicon by polishing;
forming a first metal film on a planarized surface of the amorphous silicon or the polycrystalline silicon;
forming a second metal film on the silicon substrate; and
bonding the planarized surface to the silicon substrate.

15. The method according to claim 11, wherein the optical waveguide consists of amorphous silicon.

16. The device according to claim 11, wherein the optical waveguide is formed over the active layer of the ring-shaped light-emitting element and the light-absorbing layer of the disc-shaped light-receiving element.

17. A method of manufacturing an optical interconnection device,
the device including:
an electric circuit and metal interconnections, both being formed in a silicon substrate, a portion of the interconnections being in contact with the silicon substrate without being electrically connected to the electric circuit;
a ring-shaped light-emitting element and a light-receiving element, both having a layered structure including an epitaxially grown layer and being formed over the metal interconnections, at least a portion of the ring-shaped light-emitting element being embedded in an insulator, at least a portion of the ring-shaped light-receiving element being embedded in the insulator; and an optical waveguide being formed over the insulator, the optical waveguide being optically coupled to the ring-shaped light-emitting element and the ring-shaped light-receiving element by distributed coupling, the method comprising:

forming the electric circuit in the silicon substrate;

providing a metal leading from an upper surface of a layer including the electric circuit to the silicon substrate;

forming a first metal film over the silicon substrate;

forming a second metal film over the epitaxially grown layer; and bonding the first metal film to the second metal film, wherein at least a part of the optical waveguide which is optically coupled to the disc-shaped light-receiving element consists of amorphous silicon and is in a spiral, the ring-shaped light-emitting element includes an active layer, the disc-shaped light-receiving element includes a light-absorbing layer, and the active layer of the ring-shaped light-emitting element and the light-absorbing layer of the disc-shaped light-receiving element are at a same height above the silicon substrate.

18. The method according to claim 17, wherein the optical waveguide consists of amorphous silicon.

19. The device according to claim 17, wherein the optical waveguide is formed over the active layer of the ring-shaped light-emitting element and the light-absorbing layer of the disc-shaped light-receiving element.

20. A method of manufacturing an optical interconnection device, the method comprising: bonding an epitaxially grown layer to a silicon substrate, the epitaxially grown layer being to form a ring-shaped light-emitting element or a light-receiving element, an optical waveguide being formed over a semiconductor substrate;

removing the semiconductor substrate; and forming the ring-shaped light-emitting element or the ring-shaped light-receiving element, wherein at least a part of the optical waveguide which is optically coupled to the disc-shaped light-receiving element consists of amorphous silicon and is in a spiral, the ring-shaped light-emitting element includes an active layer, the disc-shaped light-receiving element includes a light-absorbing layer, and the active layer of the ring-shaped light-emitting element and the light-absorbing layer of the disc-shaped light-receiving element are at a same height above the silicon substrate.

21. The method according to claim 20, further comprising:

depositing a dielectric film over a first substrate, the first substrate including a compound semiconductors with the epitaxially grown layer formed on the first substrate;

planarizing the first substrate by polishing;

depositing a dielectric film or forming an oxide film over a second substrate, the second substrate including a silicon substrate with a waveguide pattern formed on the second substrate;

planarizing the second substrate by polishing; and bonding planarized surfaces of the first and second substrates to each other.

22. The method according to claim 20, wherein the optical waveguide consists of amorphous silicon.

23. The device according to claim 20, wherein the optical waveguide is formed over the active layer of the ring-shaped light-emitting element and the light-absorbing layer of the disc-shaped light-receiving element.

* * * * *